(12) United States Patent
Moon et al.

(10) Patent No.: US 12,142,206 B2
(45) Date of Patent: *Nov. 12, 2024

(54) DISPLAY DEVICE

(71) Applicant: SAMSUNG DISPLAY CO., LTD., Yongin-si (KR)

(72) Inventors: Sang-Ho Moon, Cheonan-si (KR); Chun Gi You, Anyang-si (KR); Hyoung Hak Kim, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/310,516

(22) Filed: May 1, 2023

(65) Prior Publication Data
US 2023/0267880 A1   Aug. 24, 2023

Related U.S. Application Data

(63) Continuation of application No. 17/822,676, filed on Aug. 26, 2022, now Pat. No. 11,640,789, which is a
(Continued)

(30) Foreign Application Priority Data

Jul. 17, 2020 (KR) .......................... 10-2020-0088741

(51) Int. Cl.
*G09G 3/3225* (2016.01)
*H10K 50/842* (2023.01)
(Continued)

(52) U.S. Cl.
CPC ....... *G09G 3/3225* (2013.01); *H10K 50/8426* (2023.02); *H10K 59/122* (2023.02); *H10K 59/131* (2023.02)

(58) Field of Classification Search
CPC .............. G09G 3/3258; G09G 3/2003; G09G 3/3266; G09G 3/3291; H10K 59/131; H10K 59/124
See application file for complete search history.

(56) References Cited

U.S. PATENT DOCUMENTS 9,007,355 B2   4/2015   Gang et al.
9,514,673 B2   12/2016  Kwon et al.

FOREIGN PATENT DOCUMENTS

KR    10-2012-0031367 A    4/2012
KR       10-1420479 B1     7/2014
(Continued)

*Primary Examiner* — Sardis F Azongha
(74) *Attorney, Agent, or Firm* — Lewis Roca Rothgerber Christie LLP

(57) ABSTRACT

A display device includes: a substrate including a display area configured to display images and a non-display area around the display area; a plurality of driving voltage lines in the display area; a plurality of initialization voltage lines in the display area; a plurality of driving voltage transmission lines in the non-display area and configured to transmit a driving voltage to the driving voltage line, and including a first driving voltage transmission line and a second driving voltage transmission line adjacent to each other; an initialization voltage transmission line in the non-display area and configured to transmit an initialization voltage to the initialization voltage line; and a bridge connecting the first driving voltage transmission line and the second driving voltage transmission line and overlapping the initialization voltage transmission line.

20 Claims, 17 Drawing Sheets

Related U.S. Application Data continuation of application No. 17/349,841, filed on Jun. 16, 2021, now Pat. No. 11,436,976.

(51) Int. Cl.
*H10K 59/122* (2023.01)
*H10K 59/131* (2023.01)

(56) References Cited

FOREIGN PATENT DOCUMENTS

| | | |
|---|---|---|
| KR | 10-2018-0004382 A | 1/2018 |
| KR | 10-2086644 B1 | 3/2020 |
| KR | 10-2020-0034902 A | 4/2020 |

DISPLAY DEVICE

CROSS-REFERENCE TO RELATED APPLICATIONS

This application is a continuation of U.S. patent application Ser. No. 17/822,676, filed Aug. 26, 2022, which is a continuation of U.S. patent application Ser. No. 17/349,841, filed Jun. 16, 2021, now U.S. Pat. No. 11,436,976, which claims priority to and the benefit of Korean Patent Application No. 10-2020-0088741, filed Jul. 17, 2020, the entire content of all of which is incorporated herein by reference.

BACKGROUND

1. Field

Aspects of some example embodiments according to the present disclosure relate to a display device.

2. Description of the Related Art

A display device includes a display panel where pixels are formed on a substrate. The pixels are arranged in a display area of the display panel and thus form a screen that displays images. The display panel may receive various signals to drive the pixels. The signals may include not only a data signal for controlling luminance of the pixel but also a power signal such as a driving voltage, a common voltage, and the like.

The pixel may be implemented by a light emitting element, and the display panel may include circuit elements for driving the light emitting element in the display area. Such circuit elements may include transistors, and some transistors may be applied with a driving voltage through the driving voltage line. A wire (e.g., a driving voltage transmission line) for transmitting the driving voltage to the driving voltage line may be located in the peripheral area around the display area, and when a length of such wire increases or a width decreases, resistance, current density, and voltage drop increase, which may cause deterioration of luminance uniformity in an image displayed in the area.

The above information disclosed in this Background section is only for enhancement of understanding of the background and therefore the information discussed in this Background section does not necessarily constitute prior art.

SUMMARY

When resistance of a driving voltage transmission line is reduced, a driving voltage can be relatively uniformly supplied throughout a display area of a display panel. When a width of a driving voltage transmission line is increased, resistance of the driving voltage transmission line can be reduced. However, the width increase of the driving voltage transmission line may cause an increase of a non-display area of the display panel. When the non-display area of the display panel increases, a bezel or dead space of the display device may increase, and thus the screen-to-body ratio of the display device may increase.

Aspects of some example embodiments include a display device that may improve luminance uniformity of a display area without increasing a non-display area of a display panel.

A display device according to some example embodiments of the present disclosure includes: a substrate including a display area for displaying an image and a non-display area around the display area; a plurality of driving voltage lines in the display area; a plurality of initialization voltage lines in the display area; a plurality of driving voltage transmission lines in the non-display area, transmitting a driving voltage to the driving voltage line, and including a first driving voltage transmission line and a second driving voltage transmission line adjacent to each other; an initialization voltage transmission line in the non-display area and transmitting an initialization voltage to the initialization voltage line; and a bridge connecting the first driving voltage transmission line and the second driving voltage transmission line and overlapping the initialization voltage transmission line.

According to some example embodiments, the display device may further include a driving voltage bus line that extends in a first direction between the display area and the plurality of driving voltage transmission lines and is connected to the plurality of driving voltage transmission lines. The bridge may connect the first driving voltage transmission line and the second driving voltage transmission line in the first direction.

According to some example embodiments, the initialization voltage transmission line may be between the first driving voltage transmission line and the second driving voltage transmission line in the first direction.

According to some example embodiments, the display device may further include: a transistor that is in the display area; an insulation layer that is on the transistor; and a pixel electrode that is on the insulation layer in the display area and is connected with the transistor. The bridge may be in a same layer as the pixel electrode.

According to some example embodiments, the bridge may be connected to the first driving voltage transmission line and the second driving voltage transmission line through contact holes in the insulation layer.

According to some example embodiments, the display device may further include: a pixel defining layer on the insulation layer and having an opening that overlaps the pixel electrode; a common electrode on the pixel defining layer in the display area; and a common voltage transmission line in the non-display area and transmitting a common voltage to the common electrode. The bridge may overlap the common voltage transmission line.

According to some example embodiments, the common voltage transmission line may be between the first driving voltage transmission line and the second driving voltage transmission line.

According to some example embodiments, the plurality of driving voltage transmission lines, the initialization voltage transmission lines, and the common voltage transmission lines may be in a same layer.

According to some example embodiments, the display device may further include a plurality of IC chips. The first driving voltage transmission line and the second driving voltage transmission line may be connected to different IC chips among the plurality of IC chips.

According to some example embodiments, the plurality of IC chips may be in the non-display area and arranged in a first direction. The bridge may connect the first driving voltage transmission line and the second driving voltage transmission line in the first direction.

According to some example embodiments, the display device may further include: an encapsulation substrate that overlaps the substrate; and a sealant that bonds the substrate and the encapsulation substrate. Each of the first driving voltage transmission line, the second driving voltage transmission line, and the initialization voltage transmission line may include a portion that overlaps the sealant and a portion that non-overlaps the sealant.

A display device according to some example embodiments of the present disclosure includes: a substrate including a display area for displaying an image and a non-display area around the display area; a pixel in the display area; a driving voltage line in the display area and applying a driving voltage to the pixel; a plurality of driving voltage transmission lines in the non-display area, transmitting a driving voltage to the driving voltage line, and including a first driving voltage transmission line and a second driving voltage transmission line adjacent to each other; a common voltage transmission line in the non-display area and transmitting a common voltage to the pixel; and a bridge connecting the first driving voltage transmission line and the second driving voltage transmission line and overlapping the common voltage transmission line.

According to some example embodiments, the display device may further include a driving voltage bus line that extends in a first direction between the display area and the plurality of driving voltage transmission lines and is connected to the plurality of driving voltage bus lines. The bridge may connect the first driving voltage transmission line and the second driving voltage transmission line in the first direction.

According to some example embodiments, the common voltage transmission line may be between the first driving voltage transmission line and the second driving voltage transmission line in the first direction.

According to some example embodiments, the display device may further include: a transistor in the display area; an insulation layer on the transistor; and a pixel electrode on the insulation layer and connected to the transistor. The bridge may be in the same layer as the pixel electrode, and is connected to the first driving voltage transmission line and the second driving voltage transmission line through a contact hole of the insulation layer.

According to some example embodiments, the display device may further include: a pixel defining layer on the insulation layer and including an opening that overlaps the pixel electrode; and a common electrode of the pixel on the pixel defining layer. The common voltage transmission line may transmit a common voltage to the common electrode.

A display device according to some example embodiments of the present disclosure includes: a substrate including a display area for displaying an image and a non-display area around the display area; a plurality of driving voltage lines in the display area; a plurality of initialization voltage lines in the display area; a first driving voltage transmission line and a second driving voltage transmission line in the non-display area and transmitting a driving voltage to the driving voltage line, wherein each of the first and second driving voltage lines includes a first portion and a second portion that extend in different directions, and the first and second driving voltage lines are connected in a first direction by the second portions; an initialization voltage transmission line between the first portion of the first driving voltage transmission line and the first portion of the second driving voltage transmission line in the non-display area, transmitting an initialization voltage to the initialization voltage line, and including a first portion and a second portion that are separated from each other; and a bridge connecting the first portion and the second portion of the initialization voltage transmission line in a second direction that crosses the first direction.

According to some example embodiments, the display device may further include: a common voltage transmission line that is between the first portion of the first driving voltage transmission line and the first portion of the second driving voltage transmission line in the non-display area, that transmits a common voltage to the display area, and that includes a first portion and a second portion that are separated from each other; and a bridge that connects the first portion and the second portion of the common voltage transmission line in the second direction.

According to some example embodiments, the display device may further include: a transistor that is in the display area; an insulation layer that is on the transistor; and a pixel electrode that is on the insulation layer and is connected to the transistor. The bridge may be in a same layer as the pixel electrode.

According to some example embodiments, the display device may further include a plurality of IC chips, the first portion of the first driving voltage transmission line and the first portion of the second driving voltage transmission line may be connected to different IC chips among the plurality of IC chips.

According to embodiments, a display device that can improve luminance uniformity in a display area can be provided. Such a display device can be implemented without increasing a non-display area of a display panel.

DETAILED DESCRIPTION

Figure 1:
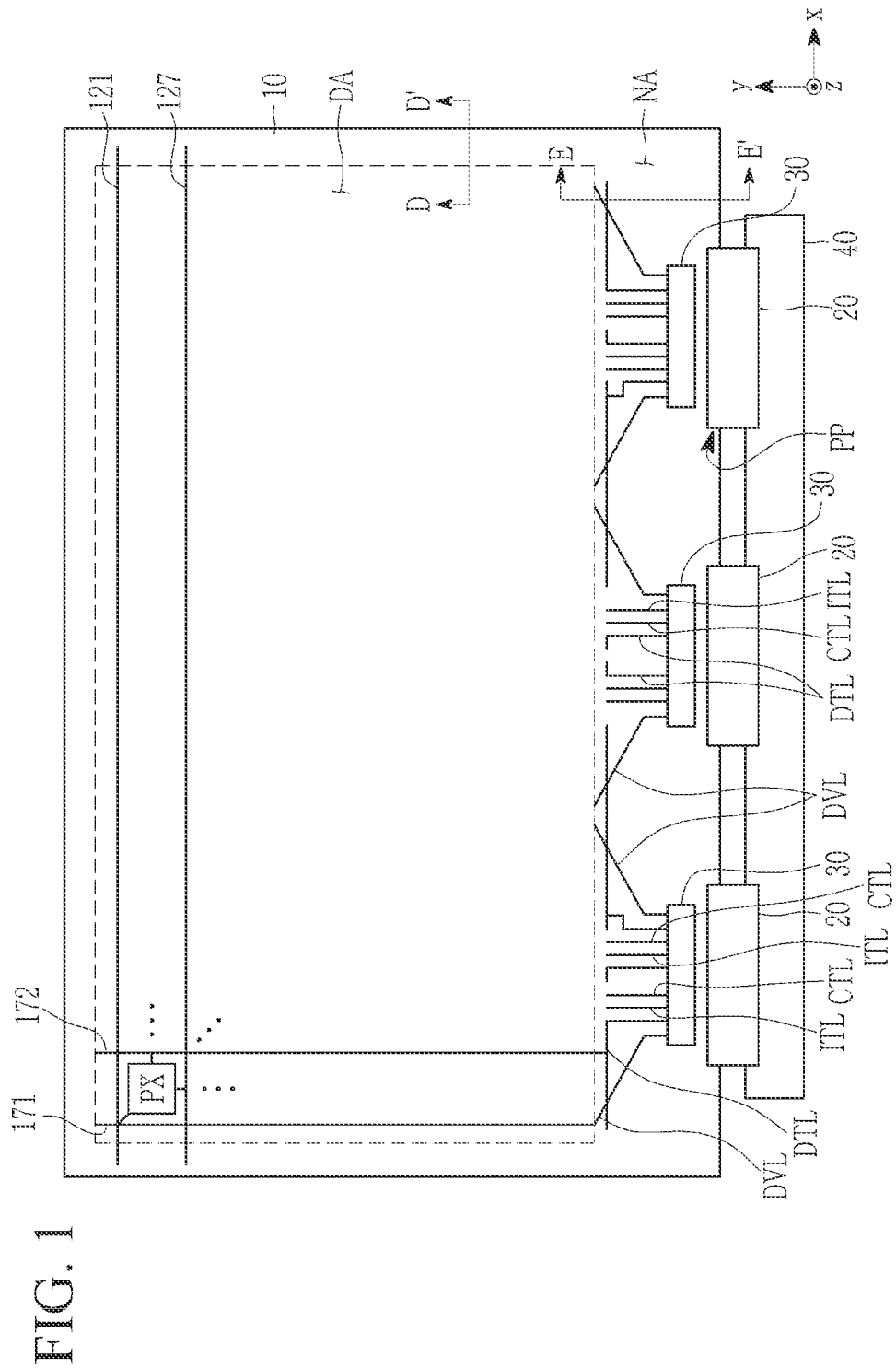
FIG. 1 is a top plan view that schematically shows a display device according to some example embodiments.

Hereinafter, aspects of some example embodiments of the inventive concept will be described more fully hereinafter with reference to the accompanying drawings, in which aspects of some example embodiments of the inventive concept are shown.

In the drawings, the thicknesses of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Throughout the specification, "connected" does not mean only when two or more constituent elements are directly connected, but also when two or more constituent elements are indirectly connected through another constituent element, or when physically connected or electrically connected, and it may include a case in which substantially integral parts are connected to each other although they are referred to by different names according to positions or functions.

In drawings, the symbol "x" used to indicate direction is a first direction, "y" is a second direction that is perpendicular to the first direction, and "z" is a third direction that is perpendicular to the first direction and the second direction. The first direction x, the second direction y, and the third direction z may correspond to a horizontal direction, a vertical direction, and a thickness direction of a display device, respectively.

Unless otherwise specified in the specification, "overlapping" means overlapping in a plan view, and overlapping in the third direction z.

FIG. 1 is a schematic plan view of a display device according to some example embodiments.

Referring to FIG. 1, a display device may include a display panel 10, a flexible printed circuit film 20, an integrated circuit (IC) chip 30, and a flexible printed circuit 40.

The display panel 10 includes a display area DA that corresponds to a screen where images are displayed, and a non-display area NA where circuits and/or signal lines for generating and/or transmitting various signals applied to the display area DA is formed. The non-display area NA may surround the display area DA. In FIG. 1, the boundary between the display area DA and the non-display area NA is shown as a dotted line quadrangle.

Pixels PX may be arranged in a matrix format in the display area DA of the display panel 10. Signal lines such as a scan line 121, an initialization voltage line 127, a data line 171, and a driving voltage line 172 may be located in the display area DA. The scan line 121 and the initialization voltage line 127 may extend approximately in a first direction x, and the data line 171 and the driving voltage line 172 may extend approximately in a second direction y. The initialization voltage line 127 includes a voltage line that extends approximately in the first direction x and a voltage line that extends approximately in the second direction y, and thus may be arranged in a mesh shape. Each pixel PX is connected with the scan line 121, the initialization voltage line 127, the data line 171, the driving voltage line 172, and the like, and thus each pixel PX may receive a scan signal, an initialization voltage, a data voltage, a driving voltage, and the like from the signal lines. Each pixel PX may also receive a common voltage. The pixel PX may be implemented as a light-emitting element such as a light-emitting diode.

A touch sensor for detecting a user's contact and/or non-contact touch may be located in the display area DA of the display panel 10.

A pad portion PP where pads for receiving signals from outside of the display panel 10 may be located in the non-display area NA of the display panel 10, and the flexible printed circuit film 20 may be bonded to the pad portion PP. The pads of the flexible printed circuit film 20 may be electrically connected to pads of the pad portion PP. The display panel 10 may include two or more pad portions, and the pad portions PP may be located at a distance from each other along one edge of the display panel 10. Each pad portion PP may be bonded with a corresponding flexible printed circuit film 20. The display panel 10 may include one pad portion PP depending on the size, and one flexible printed circuit film 20 may be bonded to the pad portion. Meanwhile, a pad portion for receiving signals for driving the touch sensor may be further included in the non-display area NA of the display panel 10.

A driving unit that generates and/or processes various signals for driving the display panel 10 may be located in the non-display area NA of the display panel 10. The driving unit may include a data driver applying a data signal to the data lines 171, a gate driver applying a gate signal to the scan lines 121, and a signal controller controlling the data driver and the gate driver. The pixels PX may receive a data voltage at a timing (e.g., a set or predetermined timing) according to a scan signal generated from the gate driver. The gate driver may be integrated with the display panel 10, and may be positioned on at least one side of the display area DA.

The data driver may be provided as an IC chip 30, and the IC chip 30 may be mounted on the non-display area NA of the display panel 10. The IC chip 30 may be located between the display area DA and the pad portion PP. A plurality of IC chips 30 may be provided in the display panel 10, and the plurality of IC chips 30 may be arranged along a first direction. As the size of the display panel 10 increases, the number of IC chips 30 may increase. The signal controller may be provided as an IC chip, and may be mounted on the printed circuit board 40. The data driver and the signal controller may be provided as an integrated chip. The flexible printed circuit films 20 are bonded to the printed circuit board 40 and electrically connected thereto, thereby transmitting signals between the display panel 10 and the printed circuit board 40.

The IC chip 30 may output signals provided to the display area DA. For example, the IC chip 30 may output a data voltage, a driving voltage, a common voltage, an initialization voltage, and the like. The IC chip 30 may be connected with a data voltage transmission line DVL transmitting a data voltage to the data line 171, an initialization voltage transmission line ITL transmitting an initialization voltage to the initialization voltage line 127, a common voltage transmission line CTL transmitting a common voltage to one electrode of a light emitting element that forms the pixel PX, and the like. The IC chip 30 may output signals for controlling the gate driver, and wires that transmit the signals may be connected to the IC chip 30.

The driving voltage transmission line DTL, the common voltage transmission line CTL, and the initialization voltage transmission line ITL may be formed as conductors that are positioned in the same layer in the display panel 10. The driving voltage transmission line DTL, the common voltage transmission line CTL, and the initialization voltage transmission line ITL may be arranged in the first direction x.

The data voltage transmission line DVL may be formed of a conductive layer positioned at different layers from the driving voltage transmission line DTL, the common voltage transmission line CTL, and the initialization voltage transmission line ITL in the display panel 10. At least one insulation layer may be located between the data voltage transmission line DVL, the driving voltage transmission line DTL, the common voltage transmission line CTL, and/or the initialization voltage transmission line ITL.

The data voltage transmission line DVL may be provided corresponding to the number of data lines 171 so as to transmit a different data voltage to each pixel PX through the data lines 171.

The driving voltage, the common voltage, and the initialization voltage may be applied equally to the entire pixel PX, respectively. Thus, the driving voltage transmission line DTL, the common voltage transmission line CTL, and the initialization voltage transmission line ITL may be formed and arranged to minimize a voltage drop from the IC chip 30 to the display area DA, and supply a constant voltage throughout the display area DA. One or more driving voltage transmission lines DTL, one or more common voltage transmission lines CTL, and one or more initialization voltage transmission lines ITL may be connected to each IC chip 30. The driving voltage transmission line DTL, the common voltage transmission line CTL, and the initialization voltage transmission line ITL may be symmetrically arranged with respect to approximately a second direction y of the display panel 10.

The driving voltage transmission line DTL that requires a more constant voltage supply may have a relatively wide width. In addition, each driving voltage transmission line DTL may include a portion (vertical portion) extending in the second direction y and a portion (horizontal portion) extending in the first direction x, and combinations of the horizontal portions of the driving voltage transmission lines DTL may be provided throughout one edge of the display area DA. However, because the common voltage transmission line CTL and the initialization voltage transmission line ITL are formed in the same layer as the driving voltage transmission line DTL, when the horizontal portions of the driving voltage transmission lines DTL are formed to extend continuously in the first direction x, interference with the common voltage transmission line CTL and the initialization voltage transmission line ITL, that is, a short, cannot be avoided. Accordingly, the horizontal portions of the driving voltage transmission lines DTL are not connected, and the common voltage transmission line CTL and/or the initialization voltage transmission line ITL may be located between the driving voltage transmission lines DTL. The common voltage transmission line CTL and the initialization voltage transmission line ITL may extend approximately in a second direction y. The common voltage transmission line CTL and/or the initialization voltage transmission line ITL may include portions extending approximately in the second direction y.

Because resistance is increased as a wire length is increased, the driving voltage may not be evenly transmitted throughout the display area DA. For example, a driving voltage with less voltage drop may be transmitted to an area closer to the IC chip 30 than in a far area in the display area DA. Accordingly, luminance is not uniform in the display area DA, and a specific area, for example, an area close to the IC chip 30, may have a relatively higher luminance than an area far from the IC chip 30. Image quality deterioration due to non-uniform luminance or deviation in the display area DA can be improved by electrically connecting neighboring driving voltage transmission lines DTL. Certain details of the method will be described in more detail with reference to FIG. 2 to FIG. 4.

Figure 2:
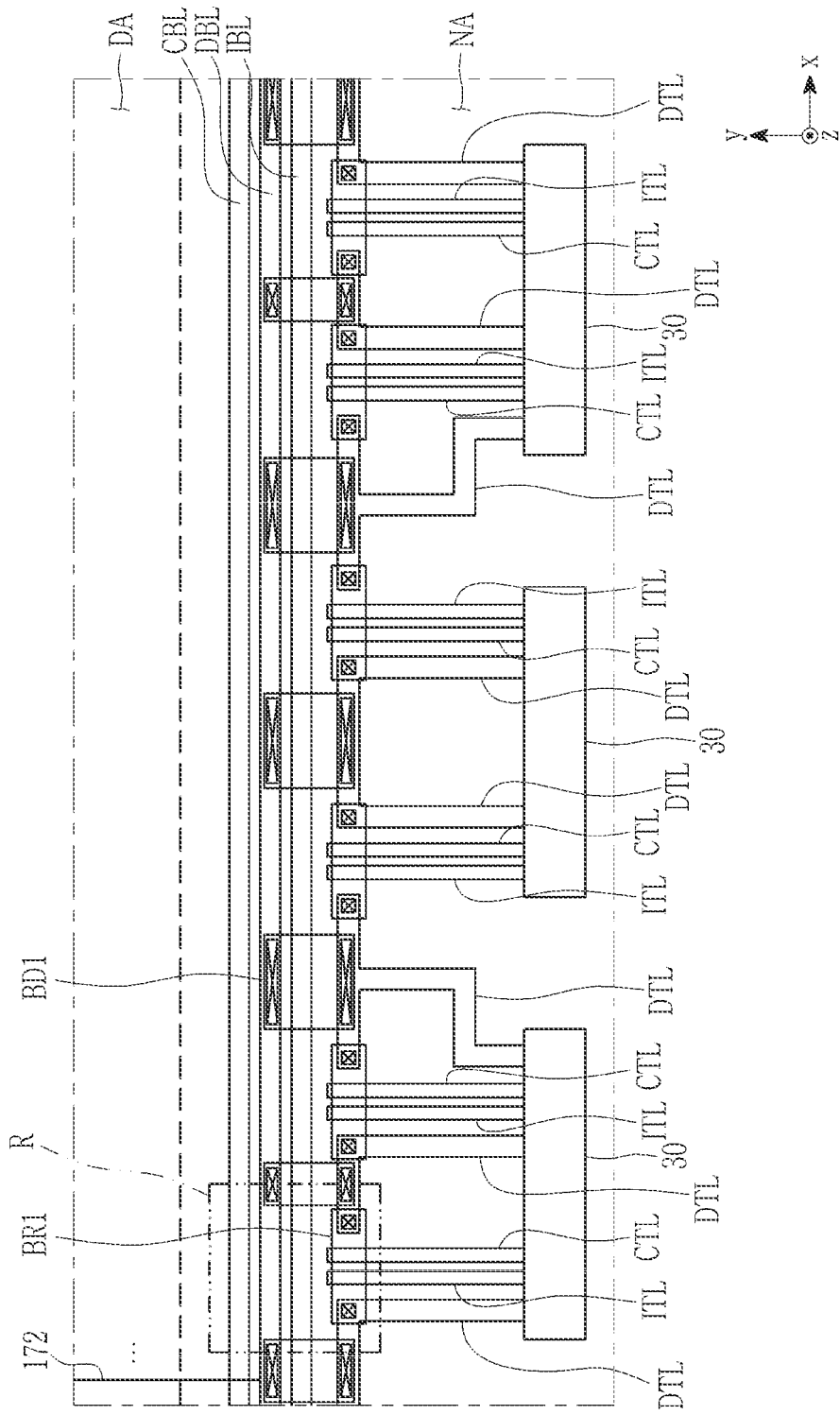
FIG. 2 is a schematic top plan view of signal lines in a lower end portion of the display device of FIG. 1 according to some example embodiments.
Figure 3:
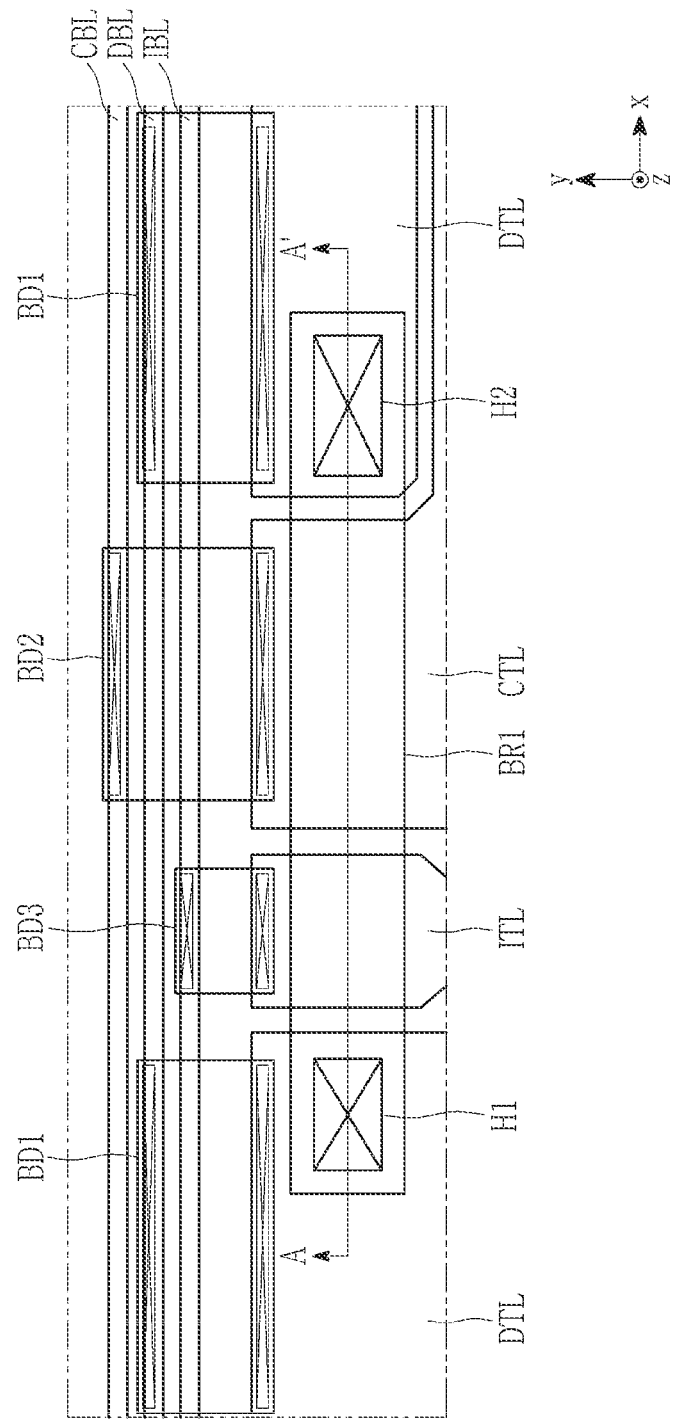
FIG. 3 is an enlarged view of the area R in FIG. 2 according to some example embodiments.
Figure 4:
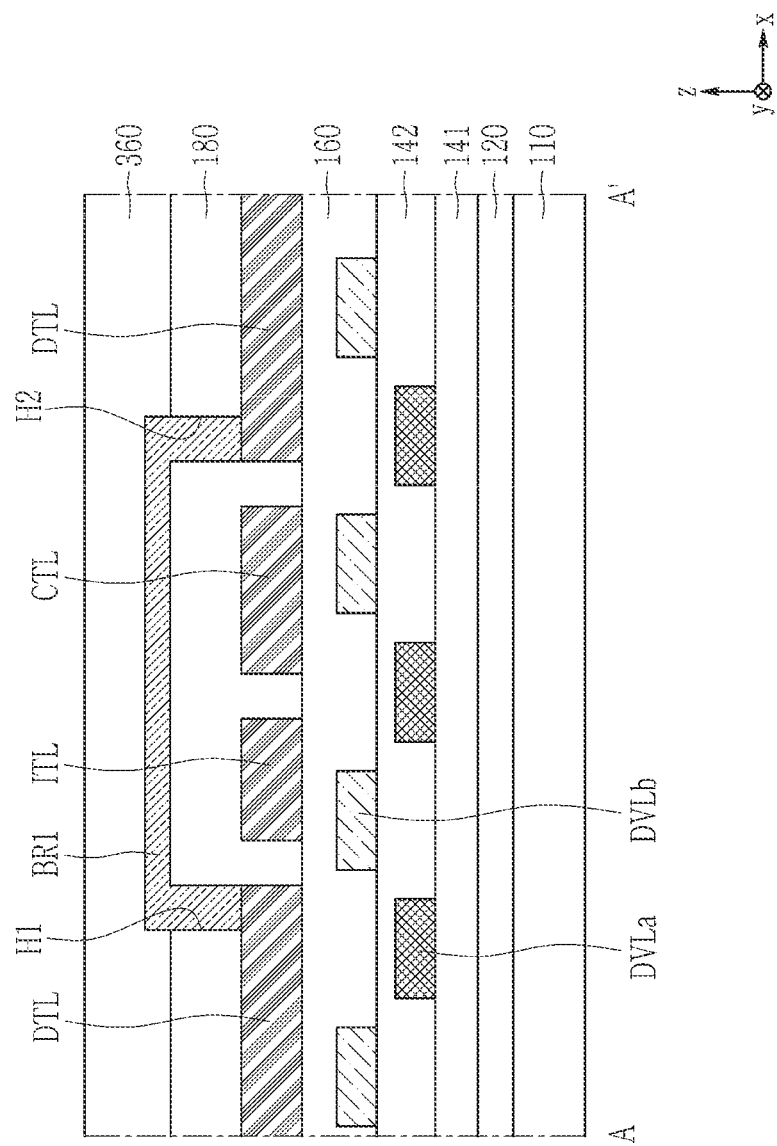
FIG. 4 is a cross-sectional view of a display device, according to some example embodiments, taken along the line A-A' of FIG. 3.

FIG. 2 is a schematic top plan view of signal lines in a lower end portion of the display device of FIG. 1, FIG. 3 is an enlarged view of the area R in FIG. 2, and FIG. 4 is a cross-sectional view of a display device, according to some example embodiments, taken along the line A-A' of FIG. 3.

Referring to FIG. 2 and FIG. 3, the driving voltage transmission lines DTL, the common voltage transmission lines CTL, the initialization voltage transmission lines ITL, and the IC chips 30 and bus lines DBL, CBL, and IBL that are connected to the signal lines in the non-display area NA located below the display area DA are illustrated.

The driving voltage transmission line DTL may apply a driving voltage to the driving voltage line 172 in the display area DA through the driving voltage bus line DBL. The common voltage transmission line CTL may apply a common voltage to an electrode of a light emitting element in the display area DA through the common voltage bus line CBL. The initialization voltage transmission line ITL may apply an initialization voltage to the initialization voltage line 127 in the display area DA through the initialization voltage bus line IBL.

The driving voltage bus line DBL, the common voltage bus line CBL, and the initialization voltage bus line IBL may extend in the first direction x between the driving voltage transmission line DTL, the common voltage transmission line CTL, and the initialization voltage transmission line ITL. Among the three bus lines DBL, CBL, and IBL, the common voltage bus line CBL is located closest to the display area DA, and the driving voltage bus line DBL may be located between the common voltage bus line CBL and the initialization voltage bus line IBL. The common voltage bus line CBL may be located not only below the display area DA but also around the display area DA.

The driving voltage transmission line DTL may be connected to the driving voltage bus line DBL through a bridge BD1. The common voltage transmission line CTL may be connected to the common voltage bus line CBL through a bridge BD2. The initialization voltage transmission line ITL may be connected to the initialization voltage bus line IBL through a bridge BD3. The bridges BD1, BD2, and BD3 may be formed in the same layer as a conductive layer that is located in a different layer from that of the driving voltage transmission line DTL in the display panel 10, for example, a pixel electrode, which will be described later. In order to more clearly show aspects of some example embodiments according to the present disclosure, only the bridge BD1 among the bridges BD1, BD2, and BD3 is shown in FIG. 2, but bridges BD2 and BD3 can be positioned between the bridges BD1 as shown in FIG. 3.

The driving voltage bus line DBL, the common voltage bus line CBL, and the initialization voltage bus line IBL may be formed as conductive layers located in the same layer in the display panel 10. The driving voltage bus line DBL, the common voltage bus line CBL, and the initialization voltage bus line IBL may be formed in the same layer as the driving voltage transmission line DTL. The driving voltage bus line DBL, the common voltage bus line CBL, and the initialization voltage bus line IBL are directly connected to the driving voltage line 172, an electrode of the light emitting element, and the initialization voltage line 127, respectively, or may be connected via other conductors. For example, the driving voltage line 172 may be connected with the driving voltage bus line DBL through a conductor that is located in a different layer from that of the common voltage bus line CBL, while overlapping the common voltage bus line CBL.

The driving voltage bus line DBL may be applied with the driving voltage from the driving voltage transmission lines DTL through the bridges BD1. Because the degree of voltage drop may vary depending on the driving voltage transmission line DTL, a driving voltage with a different degree of voltage drop may be applied depending on an area of the driving voltage bus line DBL, that is, to which the driving voltage transmission line DTL is connected to. Thus, a deviation may occur in driving voltages applied to the driving voltage lines 172 depending on a portion of the driving voltage bus line DBL to which the driving voltage line 172 is connected. In order to prevent or reduce the occurrence of such driving voltage deviation, adjacent driving voltage transmission lines DTL are connected by the bridge BR1. Thus, the driving voltage transmission lines DTL of which resistances are relatively high and low are electrically connected, and thus resistance of each driving voltage transmission line DTL can be compensated by the average value of the resistance of the driving voltage transmission lines DTL. Through such resistance average compensation, the driving voltage bus line DBL can receive a uniform driving voltage overall regardless of which driving voltage transmission line DTL it is connected to, and improve luminance non-uniformity or deviation in the display area DA. The bridge BR1 may be formed long in approximately the first direction x. The bridge BR1 may connect the driving voltage transmission lines DTL in approximately the first direction x. The bridge BR1 may connect driving voltage transmission lines DTL that are connected to the same IC chip 30, and may connect driving voltage transmission lines DTL that are connected to different IC chips 30.

Meanwhile, a width may be widened to reduce the resistance of the driving voltage bus line DBL so as to make the driving voltage uniform throughout the driving voltage bus line DBL. However, there is a limitation in widening the width of the driving voltage bus line DBL because there is a limitation in the area to arrange the driving voltage bus line DBL due to design. According to some example embodiments, the driving voltage can be uniformly supplied throughout the driving voltage bus line DBL without widening the width of the driving voltage bus line DBL.

Referring to FIG. 4, a cross-sectional structure of the display panel 10 will be described, while focusing on an area where the driving voltage transmission lines DTL are connected by the bridge BR1.

The display panel 10 may have a structure in which insulation layers and conductive layers are stacked on a substrate 110. A buffer layer 120 may be located on the substrate 110, and a first gate insulation layer 141 may be located on the buffer layer 120.

First data voltage transmission lines DVLa, a second gate insulation layer 142, and the second data voltage transmission lines DVLb may be sequentially located on the first gate insulation layer 141. The data voltage transmission lines DVL are formed as two layers, while arranging the second gate insulation layer 142 therebetween such that many more data voltage transmission lines DVL, each having a width (e.g., a set or predetermined width), can be located in a limited area.

An interlayer insulation layer 160 may be located on the second data voltage transmission lines DVLb, and the driving voltage transmission line DTL, the common voltage transmission line CTL, and the initialization voltage transmission line ITL may be located on the interlayer insulation layer 160. A planarization layer 180 may be located on the driving voltage transmission line DTL, the common voltage transmission line CTL, and the initialization voltage transmission line ITL.

The driving voltage transmission line DTL, the common voltage transmission line CTL, and the initialization voltage transmission line ITL are located in the same layer, and the common voltage transmission line CTL and the initialization voltage transmission line ITL are located between neighboring driving voltage transmission lines DTL, and thus driving voltage transmission lines DTL that are adjacent to each other between the second gate insulation layer 142 and the interlayer insulation layer 160 cannot be directly connected. Adjacent driving voltage transmission lines DTL may be electrically connected to each other by the bridge BR1 that is located on the planarization layer 180. The bridge BR1 may be connected to adjacent driving voltage transmission lines DTL through contact holes H1 and H2 of the planarization layer 180. The bridge BR1 includes a portion that overlaps the common voltage transmission line CTL and the initialization voltage transmission line ITL, but may be insulated from the common voltage transmission line CTL and the initialization voltage transmission line ITL by the planarization layer 180. The bridge BR1 may be formed of the same material as a pixel electrode, which will be described in more detail later, on the same layer as the pixel electrode. A pixel defining layer 360 that covers the bridge BR1 may be located on the planarization layer 180.

The bridge BR1 illustrated in FIG. 4 is formed by using a conductive layer that is located between the planarization layer 180 and the pixel defining layer 360, but the bridge BR1 may also be formed by using a conductive layer located between other insulation layers. This will be described as an example in more detail with reference to FIG. 5 and FIG. 6.

Figure 5:
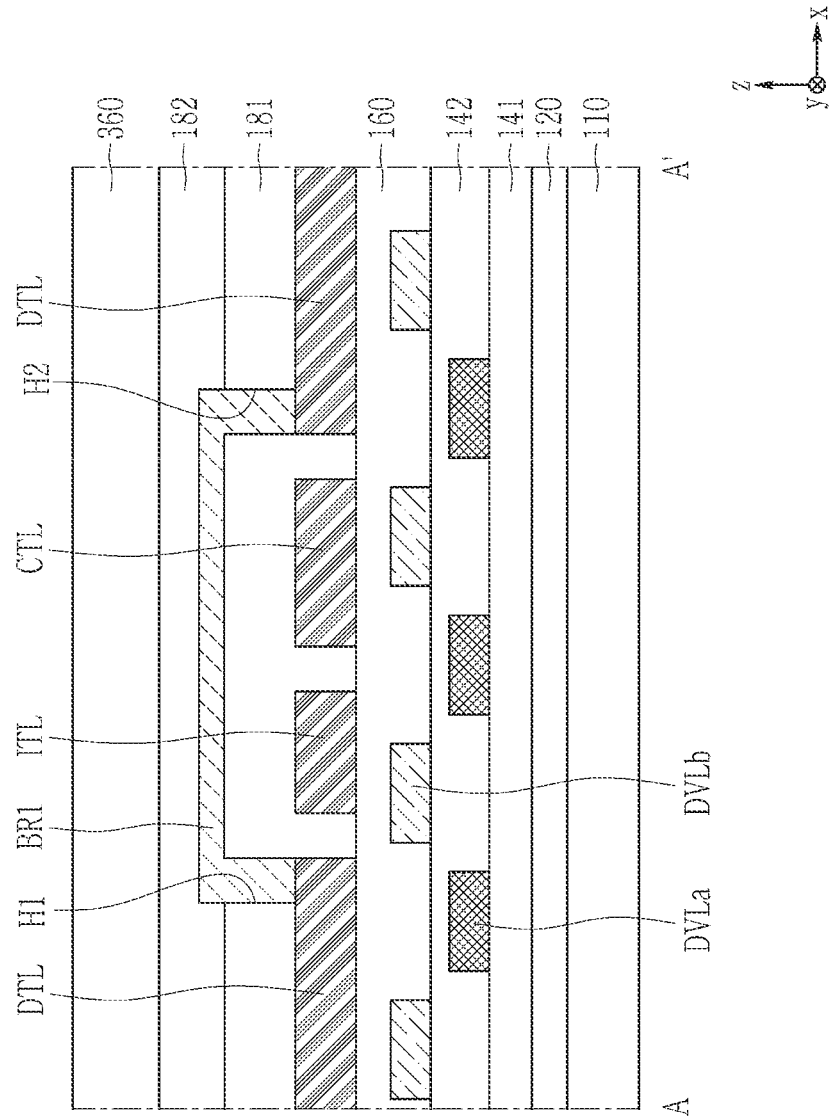
FIG. 5 is a cross-sectional view of a display device, according to some example embodiments, taken along the line A-A' of FIG. 3.
Figure 6:
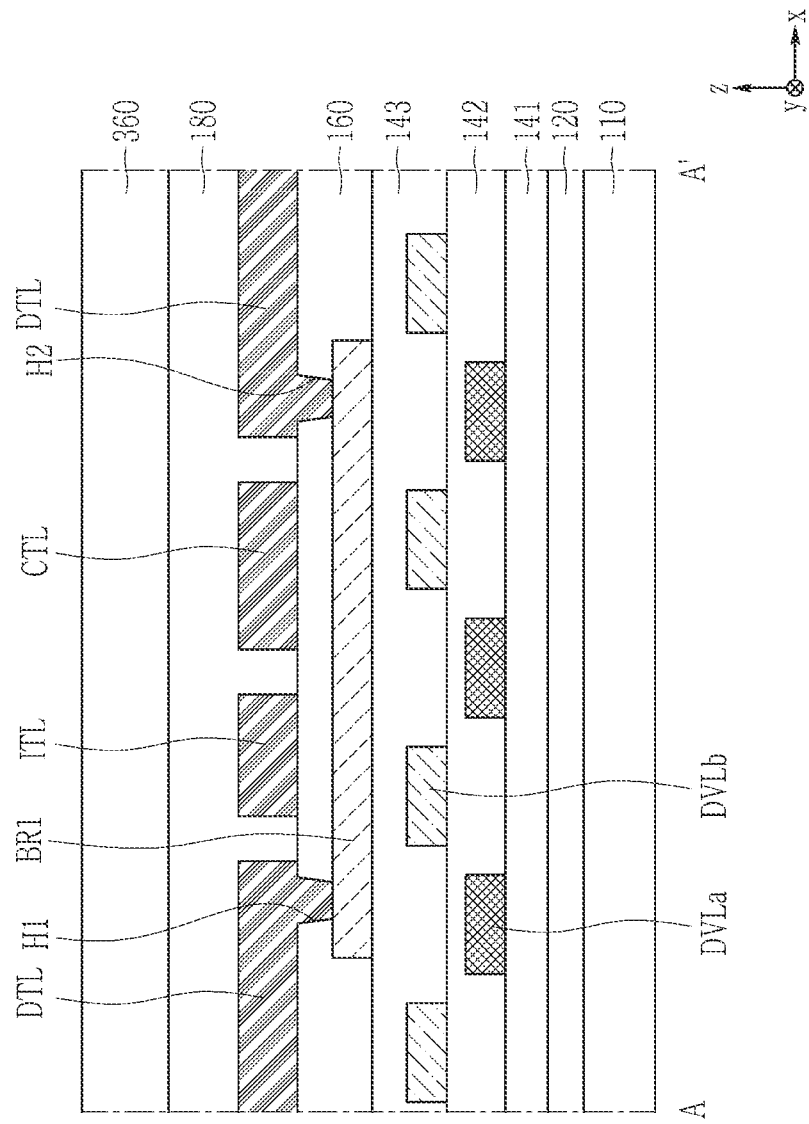
FIG. 6 is a cross-sectional view of a display device, according to some example embodiments, taken along the line A-A' of FIG. 3.

Each of FIG. 5 and FIG. 6 is a cross-sectional view of a display device, according to some example embodiments, taken along the line A-A' of FIG. 3.

Referring to FIG. 5, the planarization layer is formed of a double layer of a first planarization layer 181 and a second planarization layer 182. The first bridge BR1 that connects neighboring driving voltage transmission lines DTL is located between the first planarization layer 181 and the second planarization layer 182, and may be connected to the driving voltage transmission lines DTL through contact holes H1 and H2 of the first planarization layer 181. The bridge BR1 includes a portion that overlap the common voltage transmission line CTL and the initialization voltage transmission line ITL, but the bridge BR1 may be insulated from the common voltage transmission line CTL and the initialization voltage transmission line ITL by the first planarization layer 181. The pixel defining layer 360 that covers the bridge BR1 may be located on the second planarization layer 182.

Referring to FIG. 6, the gate insulation layer is formed of three layers of a first gate insulation layer 141, a second gate insulation layer 142, and a third gate insulation layer 143. The second data voltage transmission lines DVLb may be located between the second gate insulation layer 142 and the third gate insulation layer 143. The bridges BR1 that connect the neighboring driving voltage transmission lines DTL are located between the third gate insulation layer 143 and the interlayer insulation layer 160, and the driving voltage transmission lines DTL may be connected to the bridges BR1 through contact holes H1 and H2 of the third gate insulation layer 143. The common voltage transmission line CTL and the initialization voltage transmission line ITL include portions that overlap the bridge BR1, but may be insulated from each other by the interlayer insulation layer 160. As described, the bridge BR1 may be formed by using a conductive layer that is located between the second data voltage transmission lines DVLb and the driving voltage transmission lines DTL.

Figure 7:
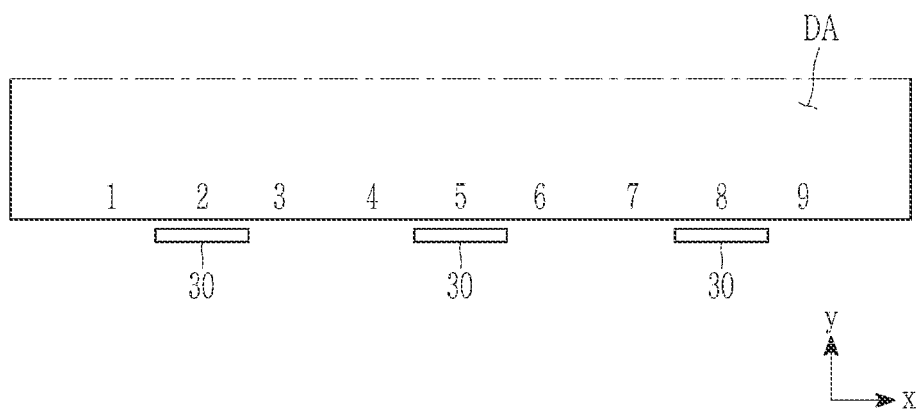
FIG. 7 and FIG. 8 show luminance of each position in a lower end portion of a display area of a display device according to a comparative example.
Figure 8:
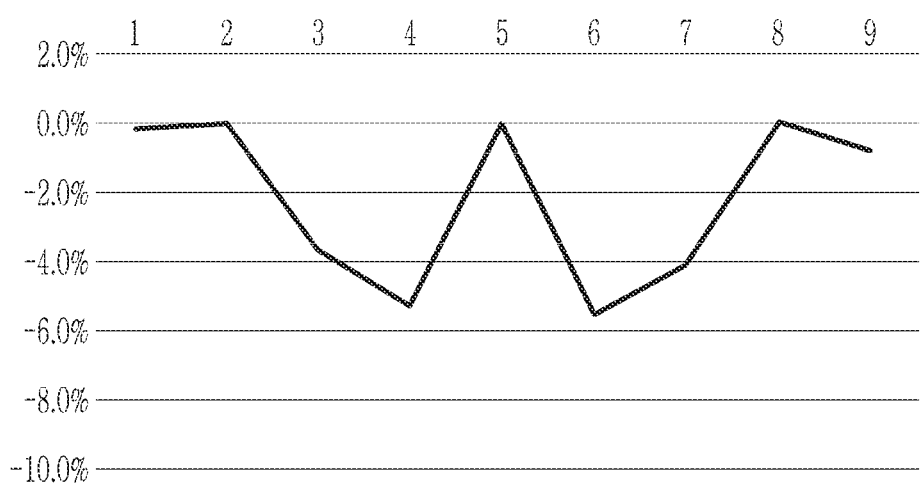
Figure 9:
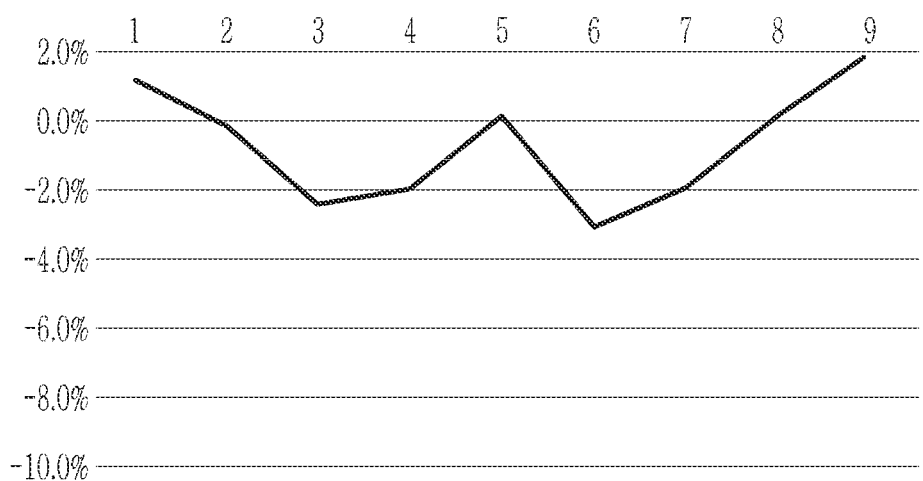
FIG. 9 shows luminance of each portion in a lower end of the display area of the display device according to some example embodiments.

FIG. 7 and FIG. 8 show luminance of each position in a lower end portion of a display area of a display device according to a comparative example, and FIG. 9 shows luminance of each portion in a lower end of the display area of the display device according to some example embodiments.

Referring to FIG. 7 and FIG. 8, luminance at the lowest end of the display area DA in the display device in which neighboring driving voltage transmission lines DTL are not connected by the bridge BR1 as in the embodiments is illustrated. In FIG. 7, luminance of each of positions where the numbers displayed in the display area DA are placed is shown in FIG. 8. The positions 2, 5, and 8 are positions close to the IC chip 30, and the positions 1, 3, 4, 6, 7, and 9 are positions away from the IC chip 30.

As shown in the graph of FIG. 8, the positions 2, 5, and 8 had the maximum luminance, and luminance of the positions 3, 4, 6, and 7 between the IC chips 30 were about 3.3%, about 5.1%, about 5.3%, and about 3.8% lower than the maximum luminance, respectively. Such a difference in luminance may be visually recognized and the display quality of the display device may thus be deteriorated. Referring to the graph in FIG. 9, like the display device according to the comparative example, the display device according to some example embodiments in which the driving voltage transmission lines DTL are connected by the bridges BR1 may have the maximum luminance at the positions 2, 5, and 8. However, luminance at the positions 3, 4, 6, and 7 were about 2.1%, about 1.9%, about 2.8%, and about 1.9% lower than the maximum luminance, respectively. In other words, the difference in luminance by position of the display device may be reduced by about half compared to the display device of the comparative example.

Figure 10:
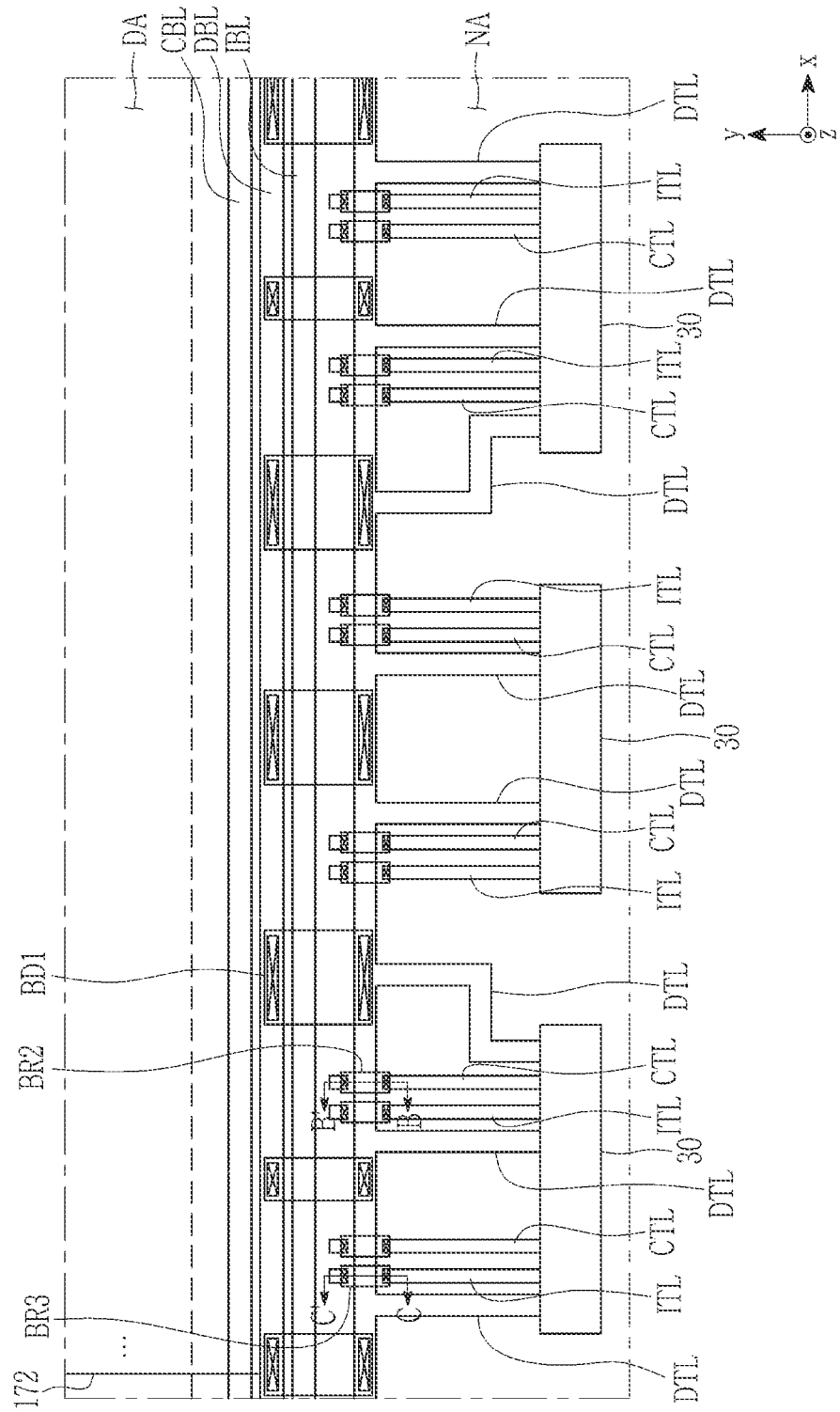
FIG. 10 is a schematic top plan view of a connection relationship of signal lines at a lower end portion of a display device according to some example embodiments.

According to some example embodiments, luminance deviation or luminance non-uniformity that may occur in the display device of the comparative example may be improved, and display quality may be improved. FIG. 10 is a schematic top plan view of a connection relationship of signal lines at a lower end portion of a display device according to some example embodiments, FIG. 11 is a cross-sectional view of a display device, according to some example embodiments, taken along the line B-B' of FIG. 10, and FIG. 12 is a cross-sectional view of a display device, according to some example embodiments, taken along the line C-C' of FIG. 10.

Figure 11:
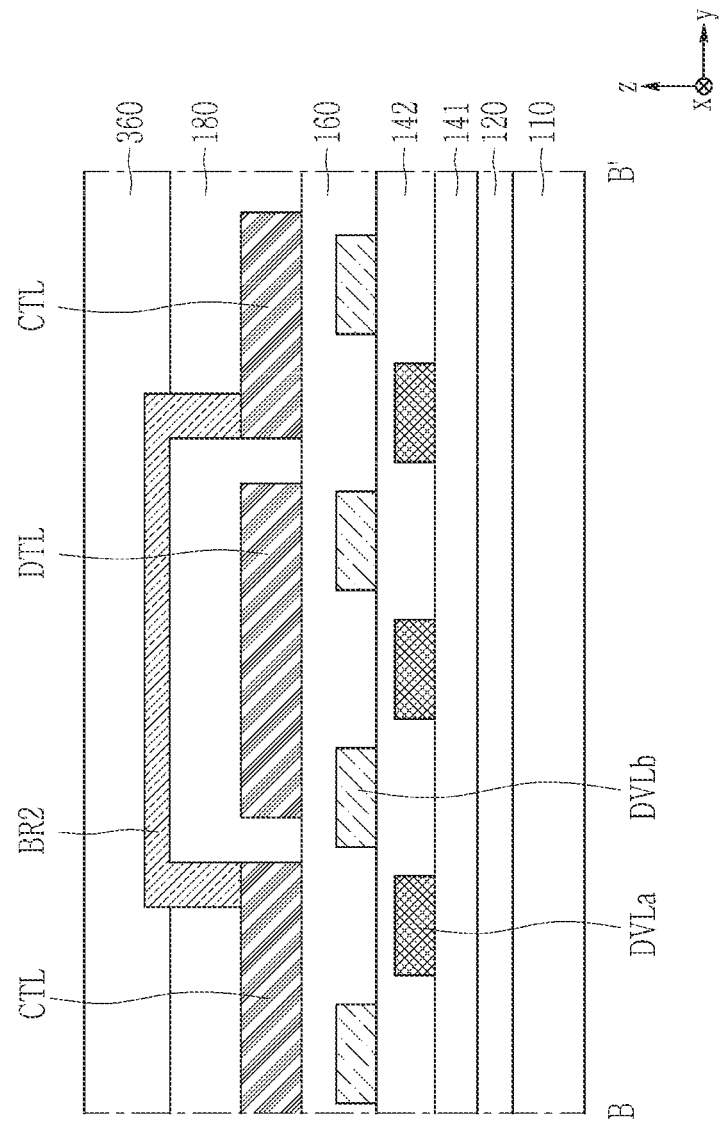
FIG. 11 is a cross-sectional view of a display device, according to some example embodiments, taken along the line B-B' of FIG. 10.
Figure 12:
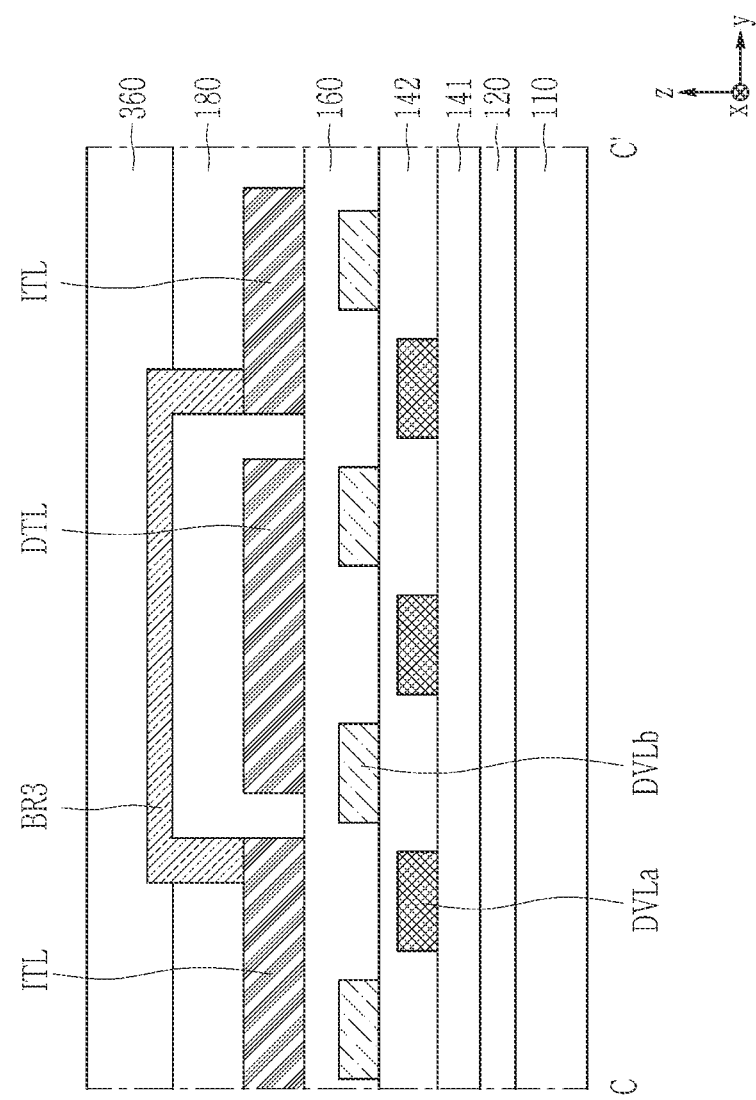
FIG. 12 is a cross-sectional view of a display device, according to some example embodiments, taken along the line C-C' of FIG. 10.

In the display device according to some example embodiments as illustrated in FIG. 10 to FIG. 12, one or more driving voltage transmission lines DTL, one or more common voltage transmission lines CTL, and one or more initialization voltage transmission lines ITL are connected to IC chips 30, respectively. The driving voltage transmission line DTL, the common voltage transmission line CTL, and the initialization voltage transmission line ITL may be formed of a conductive layer formed in the same layer in a display panel 10. Each driving voltage transmission line DTL includes a portion (horizontal portion) extending in a first direction, and the horizontal portions of the driving voltage transmission lines DTL are combined and span throughout an edge of the display area DA.

However, unlike the above-described embodiments, the horizontal portions of the driving voltage transmission lines DTL continuously extend in the first direction x. The horizontal portions of the driving voltage transmission lines DTL may be integrally formed. Thus, as in the embodiments in which driving voltage transmission lines DTL that are spaced apart from each other are connected by the bridge BR1, resistance of each driving voltage transmission line DTL is compensated by an average value of resistance of the driving voltage transmission lines DTL, thereby improving the luminance non-uniform in the display area DA.

The common voltage transmission line CTL and the initialization voltage transmission line ITL that are located between the driving voltage transmission lines DTL is formed so as to not interfere with the horizontal portions of the driving voltage transmission lines DTL.

Referring to FIG. 10 and FIG. 11, the common voltage transmission line CTL is divided into two portions in a second direction, while arranging the horizontal portion of the driving voltage transmission line DTL. The two portions divided from the common voltage transmission line CTL may be electrically connected by a bridge BR2. The bridge BR2 may extend approximately in the second direction y. The bridge BR2 may connect the two portions of the common voltage transmission line CTL in approximately the second direction y. The bridge BR2 may be located in the planarization layer 180, and may be connected to adjacent driving voltage transmission lines DTL through contact holes of the planarization layer 180. Unlike this, as in the above-described embodiments described with respect to FIG. 5, when the display panel 10 includes the first and second planarization layers 181 and 182, the bridge BR2 is located between the first planarization layer 181 and the second planarization layer 182 and thus may be connected to the two portions of the common voltage transmission line CTL through contact holes of the first planarization layer 181. As in the embodiments illustrated with respect to FIG. 6, when the display panel 10 includes the third gate insulation layer 143, the bridge BR2 may be located between the third gate insulation layer 143 and the interlayer insulation layer 160, and the two portions of the common voltage transmission line CTL may be connected to the bridge BR2 through contact holes of the third gate insulation layer 143.

Referring to FIG. 10 and FIG. 12, the initialization voltage transmission line ITL is divided into two portions in the second direction, while arranging the horizontal portion of the driving voltage transmission line DTL. In the same way that the two portions of the common voltage transmission line CTL are electrically connected by the bridge BR2, the two portions of the initialization voltage transmission line ITL can be electrically connected by a bridge BR3. The bridge BR3 may extend in approximately the second direction y. The bridge BR3 may connect the two portions of the initialization voltage transmission line ITL in approximately the second direction y.

Alternatively, the common voltage transmission line CTL extends only until the horizontal portion of the driving voltage transmission line DTL in the second direction y, and may be connected to a common voltage bus line CBL through the above-stated bridge BR2. The initialization voltage transmission line ITL extends only until the horizontal portion of the driving voltage transmission line DTL in the second direction y, and may be connected to an initialization voltage bus line IBL through the above-stated bridge BR3.

Figure 13:
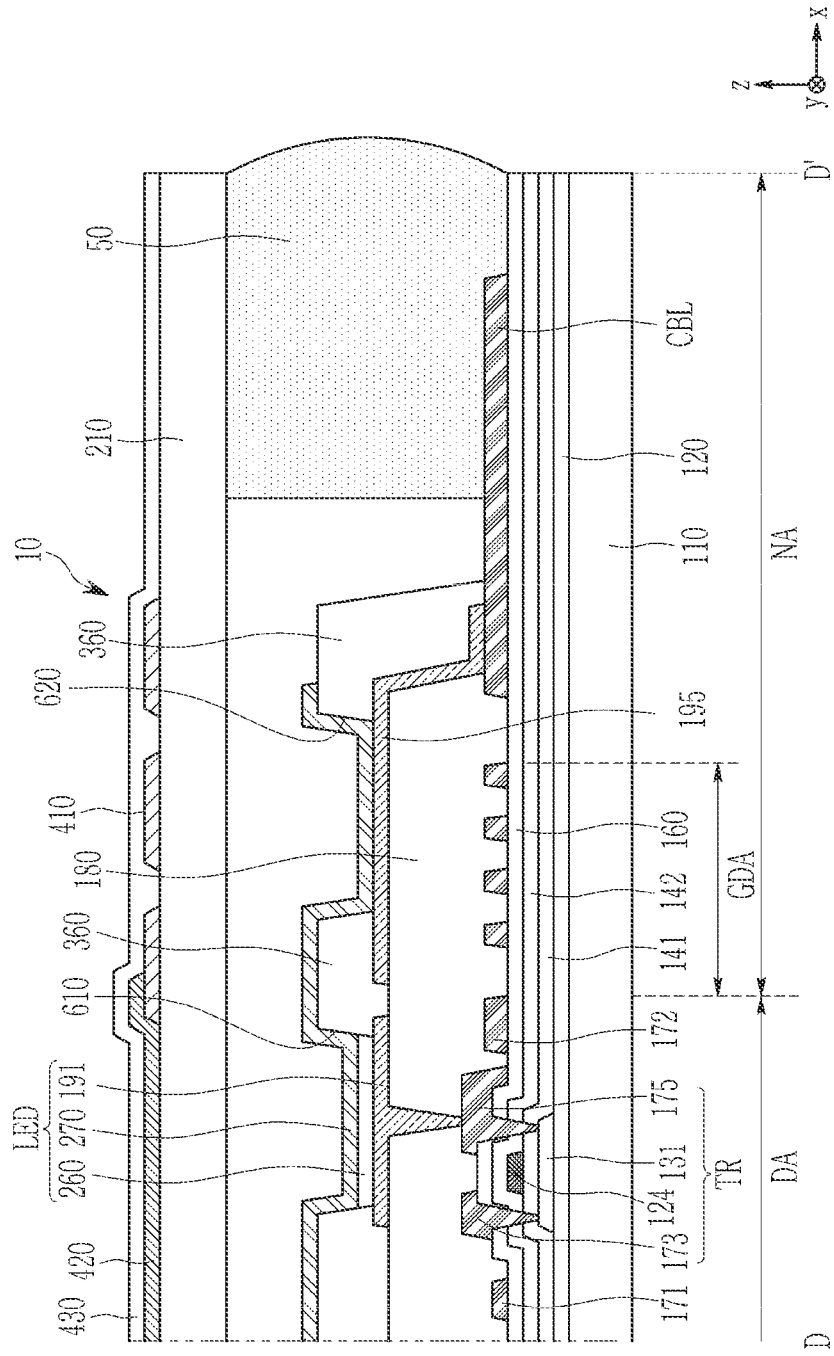
FIG. 13 is a cross-sectional view of a display device, according to some example embodiments, taken along the line D-D' of FIG. 1.
Figure 14:
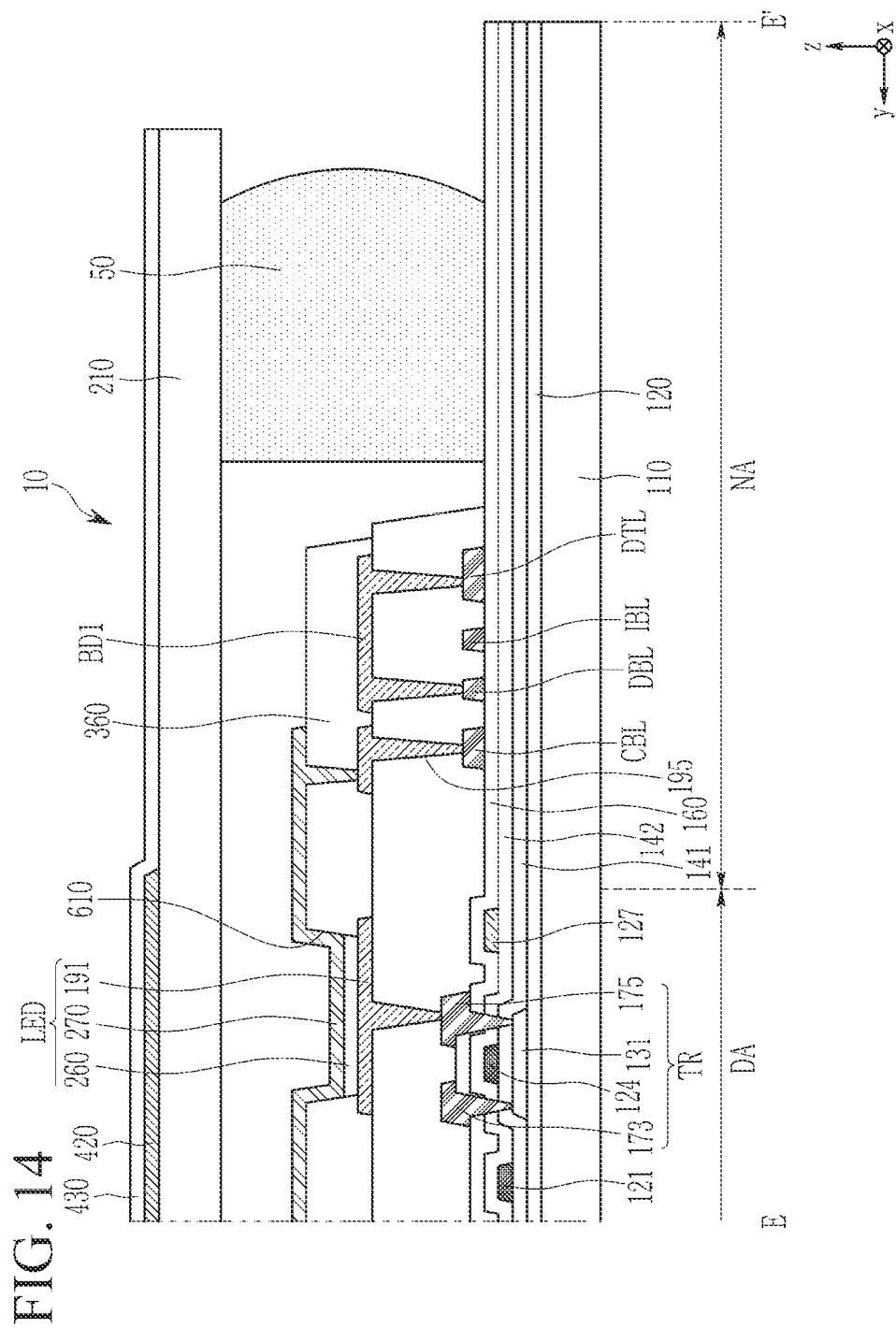
FIG. 14 is a cross-sectional view of a display device, according to some example embodiments, taken along the line E-E' of FIG. 1.

Referring to FIG. 13 and FIG. 14, a cross-sectional structure of a display device, according to some example embodiments, will be described in more detail. FIG. 13 is a cross-sectional view of a display device, according to some example embodiments, taken along the line D-D' of FIG. 1, and FIG. 14 is a cross-sectional view of a display device, according to some example embodiments, taken along the line E-E' of FIG. 1. When explaining the connection relationship between the driving voltage transmission line DTL, the common voltage transmission line CTL, and the initialization voltage transmission line ITL, FIG. 1 to FIG. 4 and FIG. 10 to FIG. 12 will also be referred to.

The display panel 10 includes a substrate 110. The substrate 110 may be an insulation substrate formed of glass, quartz, ceramic, and the like.

A buffer layer 120 may be located on the substrate 110, and a semiconductor layer 131 of a transistor TR may be located on the buffer layer 120. The semiconductor layer 131 may include a channel region, and a source region and a drain region that are located at opposite sides of the channel region. The semiconductor layer 131 may include polysilicon, amorphous silicon, or an oxide semiconductor. The buffer layer 120 may prevent or reduce diffusion or penetration of moisture, contaminants, or impurities that degrade the characteristics of the semiconductor layer 131.

A first gate insulation layer 141 may be located on the semiconductor layer 131. First gate conductors that may include a scan line 121, a gate electrode 124 of the transistor TR, a first data voltage transmission line DVLa, an electrode of a storage capacitor, and the like may be located on the first gate insulation layer 141. The gate electrode 124 may overlap the channel region of the semiconductor layer 131. The first gate conductors may be made of the same material in the same process.

A second gate insulation layer 142 may be located on the first gate conductors. Second gate conductors that may include an initialization voltage line 127, a second data voltage transmission line DVLb, an electrode of the storage capacitor, and the like may be located on the second gate insulation layer 142. The second gate conductors may be made of the same material in the same process. An interlayer insulation layer 160 may be located on the second gate conductors.

The buffer layer 120, the first gate insulation layer 141, the second gate insulation layer 142, and the interlayer insulation layer 160 may include an inorganic insulation material such as a silicon oxide (SiOx), a silicon nitride (SiNx), and the like. The first gate conductive layer and the second gate conductive layer may include a metal such as molybdenum (Mo), copper (Cu), aluminum (Al), silver (Ag), chromium (Cr), tantalum (Ta), titanium (Ti), and the like.

Data conductors that may include a data line 171, a driving voltage line 172, a source electrode 173, and a drain electrode 175 of the transistor TR, the driving voltage transmission line DTL, the common voltage transmission line CTL, the initialization voltage transmission line ITL, the driving voltage bus line DBL, the common voltage bus line CBL, the initialization voltage bus line IBL, and the like may be located on the interlayer insulation layer 160. The data conductors may be made of the same material in the same process. The data conductors may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like.

The source electrode 173 and the drain electrode 175 may be respectively connected to the source region and the drain region of the semiconductor layer 131 through contact holes of the interlayer insulation layer 160. The gate electrode 124, the source electrode 173, and the drain electrode 175 form the transistor TR, together with the semiconductor layer 131. The transistor TR may be a driving transistor in a pixel PX of a light emitting display device, or may be a transistor electrically connected with the driving transistor.

The planarization layer 180 may be located on the interlayer insulation layer 160 and the data conductors. The planarization layer 180 may include an organic insulation material such as an acryl-based polymer, a siloxane-based polymer, an imide-based polymer, and the like. The planarization layer 180 may serve to flatten by eliminating steps in order to increase luminous efficiency of a light emitting element to be formed thereon. A passivation layer that may include an inorganic insulation material may be located between the data conductors and the planarization layer 180.

According to some example embodiments, in a driving area GDA that is adjacent to the display area DA, elements (e.g., transistors, capacitors, and the like) that form a driver such as a gate driver, and wires may be located between the substrate 110 and the planarization layer 180.

Pixel conductors that include a pixel electrode 191, a connector 195, the bridges BD1, BD2, and BD3, and a bridge (BR1, or BR2 and BR3) may be located on the planarization layer 180. The pixel conductors may be made of the same material in the same process. The pixel electrode 191 may be connected to the source electrode 173 or the drain electrode 175 of the transistor TR through contact holes of the planarization layer 180. The connector 195 may be connected to the common voltage bus line CBL. Through the contact holes of the planarization layer 180, the bridge BD1 may connect the driving voltage transmission line DTL and the driving voltage bus line DBL, the bridge BD2 may connect the common voltage transmission line CTL and the common voltage bus line CBL, and the bridge BD3 may connect the initialization voltage transmission line ITL and the initialization voltage bus line IBL. The bridge BR1 may connect neighboring driving voltage transmission lines DTL through the contact holes of the planarization layer 180. The bridge BR3 may connect the two divided portions of the common voltage transmission line CTL, and the bridge BR3 may connect the two divided portions of the initialization voltage transmission portions through the contact holes of the planarization layer 180.

The pixel conductors may be formed of a reflective conducting material or a translucent conducting material, or it may be formed of a transparent conductive material. The pixel conductors may include a transparent conductive material such as an indium tin oxide (ITO) or an indium zinc oxide (IZO). The pixel conductors may include metals such as lithium (Li), calcium (Ca), aluminum (Al), silver (Ag), magnesium (Mg), and gold (Au).

A pixel defining layer 360 may be located on the pixel conductors. The pixel defining layer 360 may also be called a partition. The pixel defining layer 360 may include an opening 610 that overlaps the pixel electrode 191. The opening 610 may define an area corresponding to a light emitting area of the pixel PX. The pixel defining layer 360 may include an organic insulating material such as an acryl-based polymer, an imide-based polymer, or an amide-based polymer.

A light emitting member 260 may be located on the pixel electrode 191. The light emitting member 260 includes an emission layer, and may include at least one of a hole injection layer (HIL), a hole transport layer (HTL), an electron transport layer (ETL), or an electron injection layer (EIL).

A common electrode 270 may be located on the light emitting member 260. The common electrode 270 may include a transparent conductive material such as an indium tin oxide (ITO), an indium zinc oxide (IZO), and the like. The common electrode 270 may include a metal such as calcium (Ca), barium (Ba), magnesium (Mg), aluminum (Al), and silver (Ag). The common electrode 270 may be connected to the connector 195 through a contact hole 620 of the pixel defining layer 360. Because the connector 195 is connected to the common voltage bus line CBL and the common voltage bus line CBL is connected to the common voltage transmission line CTL, the common electrode 270 can receive a common voltage. At least one protection layer or function layer may be located on the common electrode 270.

The pixel electrode 191, the light emitting member 260, and the common electrode 270 of each pixel PX form a light emitting diode LED, which may be an organic light emitting diode (OLED). The pixel electrode 191 may be an anode, which may be a hole injection electrode, and the common electrode 270 may be a cathode, which may be an electron injection electrode, however it could be opposite thereto. Holes and electrons are injected into the light emitting member 260 respectively from the pixel electrode 191 and the common electrode 270, and when an exciton in which an injected hole and an electron combine falls from an exited state to a ground state, it emits light with a luminance (e.g., a set or predetermined luminance).

An encapsulation substrate 210 facing the substrate 110 may be an insulation substrate formed of glass, quartz, ceramic, and the like. The encapsulation substrate 210 may be bonded to the substrate 110 by a sealant 50.

A touch sensor layer that includes a touch signal line 410 and a touch electrode 420 may be located on the encapsulation substrate 210. The touch sensor layer may be used to detect a user's contact and/or non-contact touch. The touch signal line 410 may be located in a non-display area NA, and the touch electrode 420 may be located in the display area DA. The touch signal line 410 may be formed of a metal or a metal alloy, and the touch electrode 420 may be formed of a transparent conductive material, a metal mesh, and a conductivity polymer. A protective layer 430, which is an insulation layer, may be located on the touch signal line 410 and the touch electrode 420. The touch electrode 420 may be located on the touch signal line 410, or vice versa, and the touch signal line 410 and the touch electrode 420 may be located on the same layer. The touch signal line 410 and the touch electrode 420 may be located on an inner side (i.e., a side that faces the substrate 110) of the encapsulation substrate 210, or may be formed in a separate substrate and then attached to the substrate 210.

A sealant 50, which air-tightly seals the display panel 10 while bonding the substrate 110 and the encapsulation substrate 210, may be located between the substrate 110 and the encapsulation substrate 210. The driving voltage transmission line DTL, the common voltage transmission line CTL, and the initialization voltage transmission line ITL may respectively include portions that overlap the sealant 50 and portions that do not overlap the sealant 50, and the bridges BD1, BD2, BD3, BR1, BR2, and BR3 may be located inside the sealant 50 without overlapping with the sealant 50.

Figure 15:
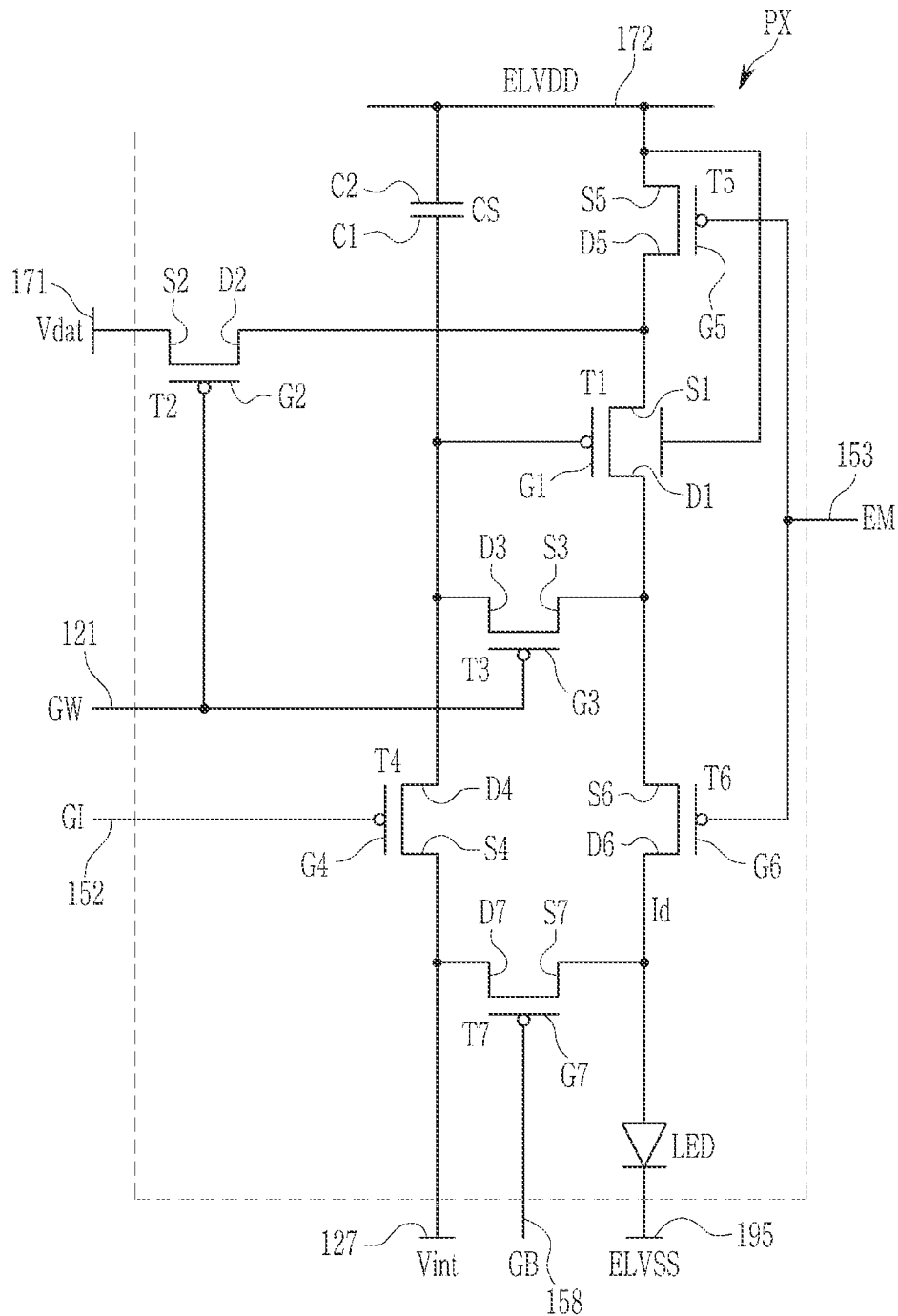
FIG. 15 is an equivalent circuit diagram of a pixel of a display device according to some example embodiments.

FIG. 15 is an equivalent circuit diagram of a pixel of a display device according to some example embodiments.

Referring to FIG. 15, a pixel PX may include transistors T1 to T7 that are connected to signal lines 121, 127, 152, 153, 158, 171, and 172, a storage capacitor CS, and a light emitting diode LED.

The transistors T1 to T7 may include a driving transistor T1, a switching transistor T2, a compensation transistor T3, an initialization transistor T4, an operation control transistor T5, a light emission control transistor T6, and a bypass transistor T7.

The signal lines 121, 127, 152, 153, 158, 171, and 172 may include a scan line 121, an initialization voltage line 127, a previous stage scan line 152, a light emission control line 153, a bypass control line 158, a data line 171, and a driving voltage line 172.

The scan line 121 may transmit a scan signal GW to the switching transistor T2 and the compensation transistor T3. The previous stage scan line 152 may transmit a previous stage scan signal GI to the initialization transistor T4. The light emission control line 153 may transmit a light emission control signal EM to the operation control transistor T5 and the light emission control transistor T6. The bypass control line 158 may transmit a bypass signal GB to the bypass transistor T7. The bypass control line 158 may be the same as or different from the previous stage scan line 152.

The data line 171 may receive a data voltage Vdat, and the driving voltage line 172 and the initialization voltage line 127 may respectively receive a driving voltage ELVDD and an initialization voltage Vint. The driving voltage line 172 is connected with the above-stated driving voltage transmission line DTL. The initialization voltage Vint may initialize the driving transistor T1.

The transistors T1 to T7 respectively include gate electrodes G1 to G7, source electrodes S1 to S7, and drain electrodes D1 to D7, and the storage capacitor CS includes a first electrode C1 and a second electrode C2. The electrodes of the transistors T1 to T7 and the electrodes of the storage capacitor CS may be connected as shown in FIG. 14. An anode of the light emitting diode LED, which may be an organic light emitting diode, may be connected with the drain electrode D1 of the driving transistor T1 through the light emission control transistor T6. A cathode of the light emitting diode LED may receive a common voltage ELVSS through a connector 195.

In the circuit structure of the pixel PX, the number of transistors, the number of capacitors, and the connections between them may be variously modified.

Figure 16:
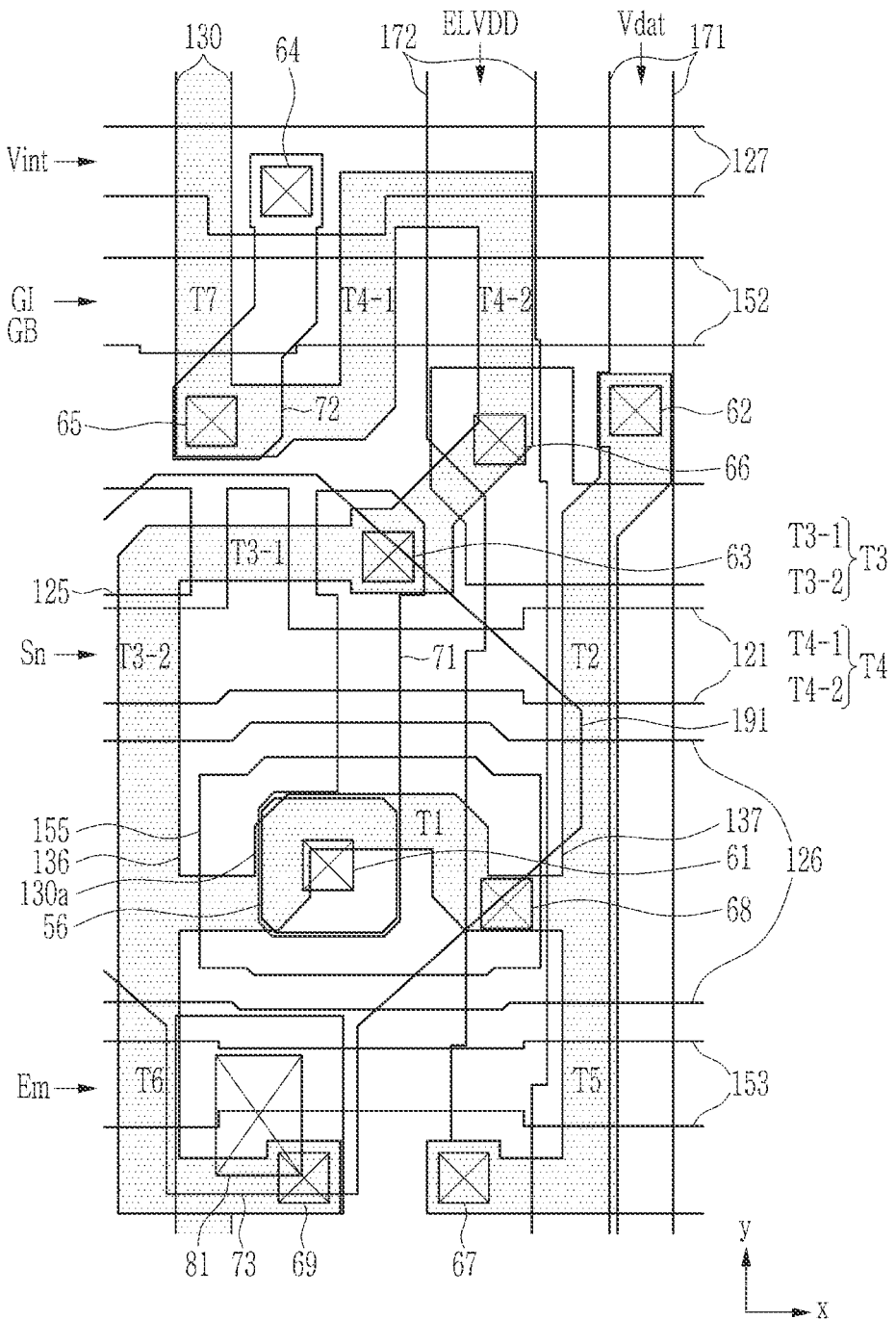
FIG. 16 is a top plan view of one pixel area in the display device according to some example embodiments.

FIG. 16 is a top plan view of one pixel area in the display device according to some example embodiments.

The scan line 121, the previous stage scan line 152, the light emission control line 153, and the initialization voltage line 127 may substantially extend in the first direction x. The bypass signal GB may be transmitted through the previous stage scan line 152. The scan line 121, the previous stage scan line 152, and the light emission control line 153 may be first gate conductors. The initialization voltage line 127 may be second gate conductors.

The data line 171 and the driving voltage line 172 may substantially extend in the second direction y. The data line 171 and the driving voltage line 172 may be gate conductors.

Among the transistors T1 to T7, the compensation transistor T3 and the initialization transistor T4 have a dual gate structure, that is, a structure in which a first compensation transistor T3-1 and a second compensation transistor T3-2 are connected and a first initialization transistor T4-1 and a second initialization transistor T4-2 are connected to prevent or reduce a leakage current.

Each channel, a source region, and a drain region of each of the transistors T1 to T7 may be located on a single semiconductor layer 130, which may be bent in various shapes.

The channels of the transistors T1 to T7 may overlap the gate electrodes of the transistors T1 to T7, and may be located between the source electrodes and the drain electrodes of the transistors T1 to T7, respectively. For example, the driving transistor T1 includes a channel 130a, a gate electrode 155, a source region 136, and a drain region 137. The channel 130a overlaps the gate electrode 155 between the source region 136 and the drain region 137. A connector 71 may be connected to the gate electrode 155 through a contact hole 61. For such a connection, the second electrode C2 of the storage capacitor CS may have an opening 56 through which the connector 71 can pass.

The gate electrode of the switching transistor T2 may be a part of the scan line 121. The data line 171 may be connected to the source electrode of the switching transistor T2 through a contact hole 62.

The compensation transistor T3 may include a first compensation transistor T3-1 and a second compensation transistor T3-2. The gate electrode of the first compensation transistor T3-1 may be a part of the scan line 121. A source electrode of the first compensation transistor T3-1 may be connected with the source electrode of the light emission control transistor T6 and the drain electrode of the driving transistor T1. A source electrode of the second compensation transistor T3-2 may be connected with a drain electrode of the first compensation transistor T3-1. A gate electrode of the second compensation transistor T3-2 may be a protrusion portion of the scan line 121. The connector 71 may be connected to a drain electrode of the second compensation transistor T3-2 through a contact hole 63.

The initialization transistor T4 may include a first initialization transistor T4-1 and a second initialization transistor T4-2. A gate electrode of the first initialization transistor T4-1 and a gate electrode of the second initialization transistor T4-2 may be a part of the previous stage scan line 152. A connector 72 may be connected to a source electrode of the first initialization transistor T4-1 through a contact hole 65. The connector 71 may be connected to a drain electrode of the second initialization transistor T4-2 through a contact hole 63. A drain electrode of the first initialization transistor T4-1 may be connected with a source electrode of the second initialization transistor T4-2. The connector 71 may be connected to the drain electrode of the second initialization transistor T4-2 through the contact hole 63.

As described, when the first and second compensation transistors T3-1 and T3-2 are formed as the compensation transistor T3 and the first and second initialization transistors T4-1 and T402 are formed as the initialization transistor T4, a leakage current can be effectively prevented or reduced by blocking an electron movement path of the channel in the off state.

The gate electrode of the operation control transistor T5 may be a part of the light emission control line 153. The driving voltage line 172 is connected to the source electrode of the operation control transistor T5 through a contact hole 67.

The gate electrode of the light emission control transistor T6 may be a part of the light emission control line 153. A connector 73 may be connected to the drain electrode of the light emission control transistor T6 through a contact hole 69. The connectors 71, 72, and 73 may be data conductors.

The gate electrode of the bypass transistor T7 may be a part of the previous stage scan line 152. The connector 73 may be connected to the source electrode of the bypass transistor T7 through a contact hole 81. The drain electrode of the bypass transistor T7 may be connected to the source electrode of the first initialization transistor T4-1.

The storage capacitor CS may include a first electrode C1 and a second electrode C2 that overlap each other, while arranging the second gate insulation layer 142 therebetween. The first electrode C1 may correspond to the gate electrode 155 of the driving transistor T1, and the second electrode C2 may be an expansion portion of a storage voltage line 126. The first electrode C1 may be first gate conductors, and the second electrode C2 may be second gate conductors.

A first end of the connector 71 may be connected to the first electrode C1 of the gate electrode 155 through the contact hole 61 and the opening 56. A second end of the connector 71 may be connected to the drain electrode of the second compensation transistor T3-2 and the drain electrode of the second initialization transistor T4-2 through the contact hole 63. The connector 71 may connect the gate electrode 155 of the driving transistor T1 to the drain electrode of the second compensation transistor T3-2 and the drain electrode of the second initialization transistor T4-2.

The driving voltage line 172 may be connected to the second electrode C2 through a contact hole 68. Therefore, the storage capacitor CS may store a charge corresponding to a difference between a driving voltage ELVDD transmitted to the second electrode C2 through the driving voltage line 172 and a gate voltage of the gate electrode 155.

The connector 72 may be connected with the initialization voltage line 127 through a contact hole 64. The connector 73 may be connected with the pixel electrode 191 through the contact hole 81.

Parasitic capacitance control patterns 125 may be located at opposite sides of the gate electrode of the second compensation transistor T3-2. A parasitic capacitor exists in the pixel, and when a voltage applied to the parasitic capacitor is changed, the image quality characteristics may be changed. The driving voltage line 172 may be connected to the parasitic capacitance control pattern 125 through a contact hole 66. Accordingly, it may be possible to prevent or reduce instances of the image quality characteristics being changed by applying a driving voltage ELVDD, which is a constant DC voltage, to the parasitic capacitor.

The contact holes 61 to 69 may be formed through the interlayer insulation layer 160, and may further penetrate the second gate insulation layer 142, or the second gate insulation layer 142 and the first gate insulation layer 141, depending on the position of the constituent element to be connected. The contact hole 81 may be formed through the planarization layer 180.

Figure 17:
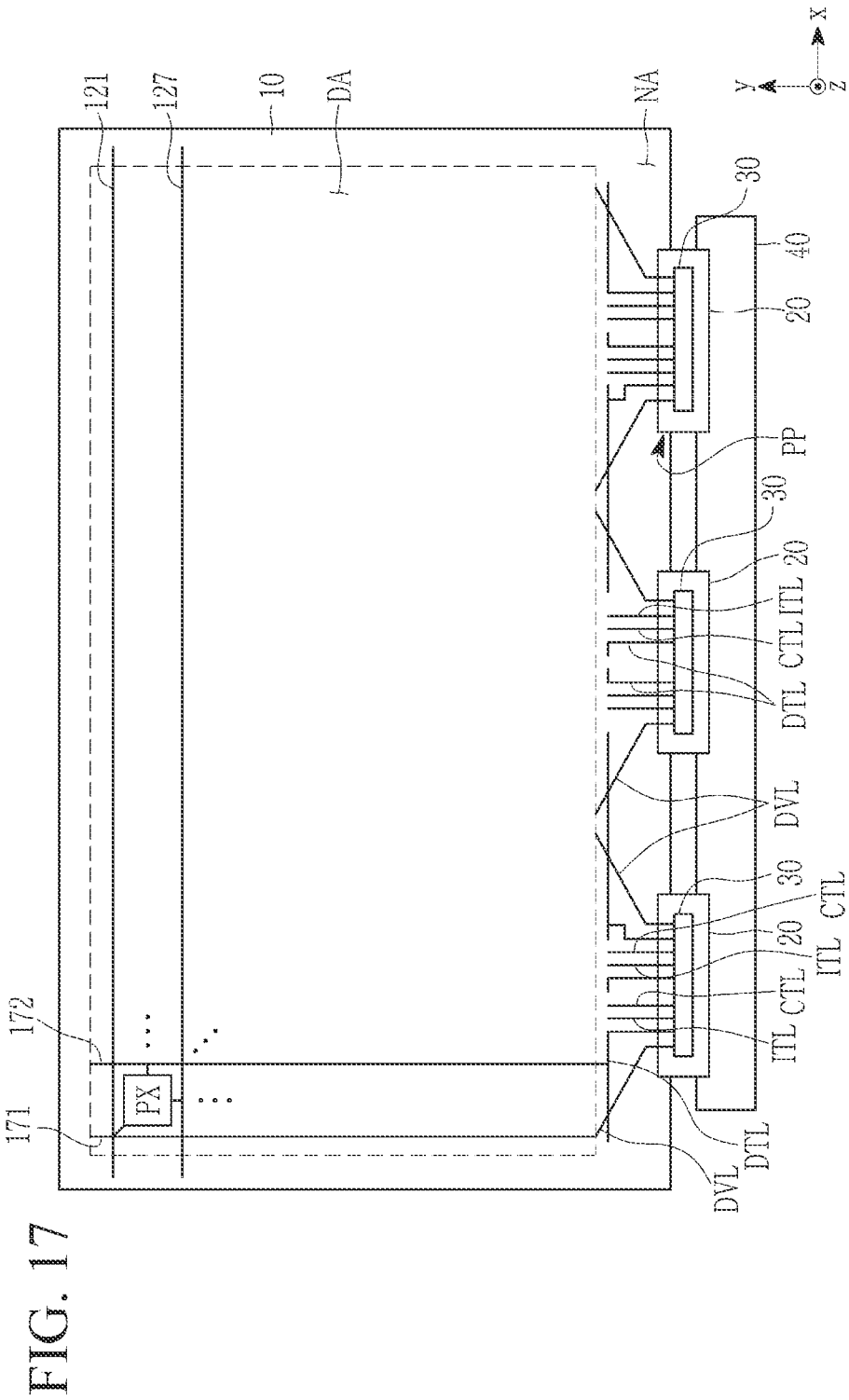
FIG. 17 is a top plan view that schematically illustrates a display device according to some example embodiments.

FIG. 17 is a top plan view that schematically illustrates a display device according to some example embodiments.

Unlike the embodiments described with respect to FIG. 1 in which the IC chip 30 is installed in the display panel 10, an IC chip 30 is installed in a flexible printed circuit film 20 in the embodiments described with respect to FIG. 17. Accordingly, signals output from the IC chip 30 may be transmitted to the display panel 10 through a pad portion of the flexible printed circuit film 20 and a pad portion of the display panel 10.

While aspects of some example embodiments of the inventive concept has been described in connection with what is presently considered to be practical embodiments, it is to be understood that embodiments according to the inventive concept are not limited to the example embodiments. On the contrary, it is intended to cover various modifications and equivalent arrangements included within the spirit and scope of the appended claims, and their equivalents.

What is claimed is:

1. A display device comprising:
a substrate including a display area configured to display images and a non-display area around the display area;
first voltage transmission lines in the non-display area and configured to transmit a first voltage, and comprising a first first voltage transmission line and a second first voltage transmission line;
a second voltage transmission line in the non-display area and configured to transmit a second voltage; and
a first pad portion in the non-display area,
wherein the second voltage transmission line is between the first first voltage transmission line and the second first voltage transmission line in a first direction, and
wherein the second voltage transmission line comprises a first portion extending from the first pad portion in a second direction crossing the first direction, a second portion extending from the first portion in the first direction, and a third portion extending from the second portion in the second direction.

2. The display device of claim 1, wherein the first portion, the second portion, and the third portion are integrally formed.

3. The display device of claim 1, further comprising:
a second pad portion in the non-display area and spaced from the first pad portion,
wherein the second voltage transmission line and the first first voltage transmission line are connected to the first pad portion, and the second first voltage transmission line is connected to the second pad portion.

4. The display device of claim 3, wherein an intersection area of the second portion and the third portion is between the first portion and the second pad portion in the first direction.

5. The display device of claim 3, further comprising:
a bus line extending in the first direction between the display area and the second voltage transmission line; and
a bridge connecting the second voltage transmission line and the bus line in the second direction and located between the first pad portion and the second pad portion in the first direction.

6. The display device of claim 5, further comprising:
a transistor in the display area;
an insulation layer over the transistor; and
a first electrode over the insulation layer in the display area and connected to the transistor,
wherein the bridge is in a same layer as the first electrode.

7. The display device of claim 3, wherein the third portion is between the first pad portion and the second pad portion in the first direction and does not overlap any of the first first voltage transmission line and the second first voltage transmission line in the second direction.

8. The display device of claim 1, wherein the second voltage transmission line, the first first voltage transmission line, and the second first voltage transmission line are in a same layer.

9. The display device of claim 1, further comprising:
a third voltage transmission line in the non-display area and configured to transmit a third voltage,
wherein the third voltage transmission line is connected to the first pad portion and does not overlap the second voltage transmission line in the second direction.

10. The display device of claim 1, further comprising:
an encapsulation substrate overlapping the substrate; and
a sealant bonding the substrate and the encapsulation substrate,
wherein the second voltage transmission line comprises a portion that overlaps the sealant and a portion that does not overlap the sealant.

11. A display device comprising:
a substrate including a display area configured to display images and a non-display area around the display area;
first voltage transmission lines in the non-display area and configured to transmit a first voltage, and comprising a first first voltage transmission line and a second first voltage transmission line;
a second voltage transmission line in the non-display area and configured to transmit a second voltage;
a first integrated circuit (IC) chip in the non-display area; and
a second IC chip in the non-display area,
wherein the second voltage transmission line is between the first first voltage transmission line and the second first voltage transmission line in a first direction, and
wherein the second voltage transmission line comprises a first portion extending from the first IC chip in a second direction crossing the first direction, a second portion extending from the first portion in the first direction, and a third portion extending from the second portion in the second direction.

12. The display device of claim 11, wherein the first portion, the second portion, and the third portion are integrally formed.

13. The display device of claim 11, wherein the second voltage transmission line and the first first voltage transmission line are connected to the first IC chip, and the second first voltage transmission line is connected to the second IC chip.

14. The display device of claim 11, wherein an intersection area of the second portion and the third portion is between the first IC chip and the second IC chip in the first direction.

15. The display device of claim 11, further comprising:
a bus line extending in the first direction between the display area and the second voltage transmission line; and
a bridge connecting the second voltage transmission line and the bus line in the second direction and located between the first IC chip and the second IC chip in the first direction.

16. The display device of claim 15, further comprising:
a transistor in the display area;
an insulation layer over the transistor; and
a first electrode over the insulation layer in the display area and connected to the transistor,
wherein the bridge is in a same layer as the first electrode.

17. The display device of claim 11, wherein the third portion is between the first IC chip and the second IC chip in the first direction and does not overlap any of the first first voltage transmission line and the second first voltage transmission line in the second direction.

18. The display device of claim 11, wherein the second voltage transmission line and the first first voltage transmission line and the second first voltage transmission line are in a same layer.

19. The display device of claim 11, further comprising:
a third voltage transmission line in the non-display area and configured to transmit a third voltage,
wherein the third voltage transmission line is connected to the first IC chip and does not overlap the second voltage transmission line in the second direction.

20. The display device of claim 11, further comprising:
an encapsulation substrate overlapping the substrate; and
a sealant bonding the substrate and the encapsulation substrate,
wherein the second voltage transmission line comprises a portion that overlaps the sealant and a portion that does not overlap the sealant.

* * * * *

UNITED STATES PATENT AND TRADEMARK OFFICE
CERTIFICATE OF CORRECTION

PATENT NO. : 12,142,206 B2  
APPLICATION NO. : 18/310516  
DATED : November 12, 2024  
INVENTOR(S) : Sang-Ho Moon et al.

Page 1 of 1

It is certified that error appears in the above-identified patent and that said Letters Patent is hereby corrected as shown below:

On the Title Page

In item (72), in Column 1, under "Inventors", Line 2, delete "Anyang-si" and insert -- Asan-si --.

In item (72), in Column 1, under "Inventors", Line 3, delete "Anyang-si" and insert -- Asan-si --.

Signed and Sealed this  
Eighteenth Day of March, 2025

Coke Morgan Stewart  
*Acting Director of the United States Patent and Trademark Office*